(12) United States Patent
Nishimura et al.

(10) Patent No.: US 10,217,933 B2
(45) Date of Patent: Feb. 26, 2019

(54) METHOD FOR ETCHING MULTILAYER FILM

(71) Applicant: TOKYO ELECTRON LIMITED, Tokyo (JP)

(72) Inventors: Eiichi Nishimura, Miyagi (JP); Mitsunori Ohata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/519,010

(22) PCT Filed: Oct. 8, 2015

(86) PCT No.: PCT/JP2015/078634
§ 371 (c)(1),
(2) Date: Apr. 13, 2017

(87) PCT Pub. No.: WO2016/060058
PCT Pub. Date: Apr. 21, 2016

(65) Prior Publication Data
US 2017/0222139 A1 Aug. 3, 2017

(30) Foreign Application Priority Data
Oct. 15, 2014 (JP) ................ 2014-210664

(51) Int. Cl.
H01L 43/12 (2006.01)
H01L 43/08 (2006.01)
(Continued)

(52) U.S. Cl.
CPC ........ *H01L 43/12* (2013.01); *H01L 21/67069* (2013.01); *H01L 27/224* (2013.01); *H01L 43/08* (2013.01)

(58) Field of Classification Search
CPC ..... H01L 43/12; H01L 43/08; H01L 21/3065; H01L 27/228; H01L 21/31116
See application file for complete search history.

(56) References Cited

U.S. PATENT DOCUMENTS 8,586,390 B2 * 11/2013 Tomioka ................. H01L 43/08
438/3
2016/0087195 A1 * 3/2016 Sonoda .................... H01L 43/12
438/3

FOREIGN PATENT DOCUMENTS

JP 2011-199243 A 10/2011
JP 2012-204408 A 10/2012
(Continued)

OTHER PUBLICATIONS

International Search Report dated Dec. 22, 2015 in PCT/JP2015/078634.

*Primary Examiner* — Tony Tran
(74) *Attorney, Agent, or Firm* — Rothwell, Figg, Ernst & Manbeck, P.C.

(57) ABSTRACT

A method according to an exemplary embodiment includes: (a) etching an upper magnetic layer by plasma generated within a processing container, the etching of the upper magnetic layer being terminated on a surface of an insulating layer; (b) removing a deposit formed on a surface of the mask and the upper magnetic layer by etching the upper magnetic layer, by the plasma generated within the processing container; and (c) etching the insulating layer by the plasma generated within the processing container. In the step of removing the deposit, the support structure that holds a processing target is inclined and rotated, and a pulse-modulated DC voltage as a bias voltage for ion attraction is applied to the support structure.

16 Claims, 21 Drawing Sheets

(51) Int. Cl.
*H01L 21/67* (2006.01)
*H01L 27/22* (2006.01)

(56) References Cited

FOREIGN PATENT DOCUMENTS

WO 2014/080782 A1 5/2014
WO 2014/080823 A1 5/2014

* cited by examiner (a)

(b)

(a)

(b)

(a)

(b)

(a)

(b)

METHOD FOR ETCHING MULTILAYER FILM

CROSS REFERENCE TO RELATED APPLICATIONS

This application is a national phase of PCT application No. PCT/JP2015/078634, filed on Oct. 8, 2015, which claims priority from Japanese patent application No. 2014-210664, filed on Oct. 15, 2014, all of which are incorporated herein by reference.

TECHNICAL FIELD

An exemplary embodiment of the present disclosure relates to a plasma processing apparatus.

BACKGROUND

As a kind of a memory device using a magnetoresistance effect element, a magnetic random access memory (MRAM) device having a magnetic tunnel junction (MTJ) structure has attracted attention.

The MRAM device includes a multilayer film made of a hardly etchable material containing a metal, such as, for example, a ferromagnetic substance. In the manufacturing of such an MRAM device, the multilayer film is etched using a mask made of a metallic material, such as, for example, Ta (tantalum), and TiN. In such an etching, a halogen gas has conventionally been used as disclosed in Japanese Patent Laid-Open Publication No. 2012-204408.

PRIOR ART DOCUMENT

Patent Document

Patent Document 1: Japanese Patent Laid-Open Publication No. 2012-204408

DISCLOSURE OF THE INVENTION

Problems to be Solved

The inventors of the present disclosure have attempted to etch a multilayer film by etching using plasma of a processing gas containing a rare gas. In the etching, the multilayer film is etched by a sputtering effect of ions derived from the rare gas. However, in the etching, the etched-off metal adheres to a surface of a shape formed by the etching to form deposit. Accordingly, the shape becomes thicker in a laminate direction away from the mask. That is, the shape is tapered. Thus, it is required to increase the perpendicularity of the shape formed by etching. Also, in such etching, it is also required to selectively etch an etching target film with respect to the mask and the underlayer thereof.

Means to Solve the Problems

According to an aspect, provided is a plasma processing apparatus. The plasma processing apparatus includes a processing container, a gas supply system, a plasma source, a support structure, and an exhaust system. The processing container provides a space where a plasma processing is to be performed on a processing target. The gas supply system supplies a gas into the processing container. The plasma source excites the gas supplied by the gas supply system. The support structure holds the processing target within the processing container. The exhaust system is provided to evacuate the space within the processing container. The exhaust system is provided just below the support structure. The gas supply system includes a first gas supply unit that supplies a first processing gas into the processing container, and a second gas supply unit that supplies a second processing gas into the processing container. The plasma processing apparatus further includes a controller that controls the first gas supply unit and the second gas supply unit to individually adjust a supply amount of the first processing gas and a supply amount of the second processing gas according to a plasma state at the time of plasma generation or at the time of plasma extinction within the processing container. The support structure is configured to rotatably and tiltably support the processing target. The plasma processing apparatus further includes a bias power supply unit that applies a pulse-modulated DC voltage, as a bias voltage for ion attraction, to the support structure.

In the plasma processing apparatus, in a state where the support structure is inclined, that is, in a state where the processing target is inclined with respect to the plasma source, a plasma etching may be performed. Accordingly, ions may be incident onto the side surface of a shape formed by etching. Also, in a state where the support structure is inclined, the support structure may be rotated. Accordingly, it is possible to cause ions to be incident toward the entire region of the side surface of the shape formed by etching, thereby improving the in-plane uniformity in the ions incident on the processing target. As a result, it is possible to remove the deposits adhering to the side surface in the entire region of the side surface of the shape formed by the etching, thereby improving the perpendicularity of the shape. Also, deposits may be uniformly removed in the plane of the processing target, and the in-plane uniformity of the shape formed by etching is improved.

Also, in the plasma processing apparatus, as a bias voltage for ion attraction, a pulse-modulated DC voltage may be used. According to the pulse-modulated DC voltage, it is possible to attract ions with relatively low energy and a narrow energy band to the processing target. Accordingly, a region constituted by specific substances (for example, a film or a deposit) may be selectively etched.

In an exemplary embodiment, the first processing gas may be a rare gas, and the second processing gas may be a hydrogen-containing gas. As the hydrogen-containing gas, $CH_4$ gas, and $NH_3$ gas are exemplified. The first processing gas and the second processing gas may be excited by the plasma source.

In the exemplary embodiment, the first processing gas may be a gas containing hydrogen, oxygen, chlorine or fluorine. The active species of these elements may react with substances included in the film and/or deposit to be etched to form a substance that is easily reactive with the second processing gas. Also, the second processing gas may contain a gas that reacts with the substances included in the film and/or deposit to be etched depending on the temperature of a placing table. Otherwise, the second processing gas may be an electron donating gas. The second processing gas may not be excited.

In the exemplary embodiment, the support structure may include a tilting shaft unit. The tilting shaft unit extends on a first axis extending in a direction perpendicular to a vertical direction. Also, the plasma processing apparatus may further include a driving device. The driving device is a device that pivotally supports the tilting shaft unit and rotates the support structure around the first axis, and is provided outside the processing container. Also, the support structure has a sealing structure in which a hollow interior may be maintained at atmosphere pressure. According to the exemplary embodiment, the inside of the support structure and the space for plasma processing within the processing container may be separated from each other, and thus various mechanisms may be provided in the support structure.

In the exemplary embodiment, the support structure may include a holding unit, a container unit, a magnetic fluid seal unit, and a rotary motor. The holding unit is a holding unit that holds the processing target, and is rotatable around a second axis perpendicular to the first axis. In the exemplary embodiment, the holding unit may include an electrostatic chuck. The container unit forms the hollow interior of the support structure, together with the holding unit. The magnetic fluid seal unit seals the support structure. The rotary motor is provided within the container unit, and rotates the holding unit. According to the exemplary embodiment, while the holding unit that holds the processing target may be inclined, the holding unit may be rotated.

In the exemplary embodiment, the support structure may further include a conduction belt provided within the container unit and connecting the rotary motor to the holding unit.

In the exemplary embodiment, the tilting shaft unit may have a tubular shape. In the exemplary embodiment, the bias power supply unit may be electrically connected to the holding unit via a wiring extending to the inside of the container unit through an inner hole of the tilting shaft unit.

In the exemplary embodiment, in a state where the support structure is not inclined, the second axis may coincide with the central axis of the plasma source.

In the exemplary embodiment, the tilting shaft unit may extend on the first axis including a position between the center of the support structure and the holding unit. In the exemplary embodiment, when the support structure is inclined, a difference in a distance from the plasma source to each position of the processing target may be reduced. Accordingly, the in-plane uniformity of etching is further improved. In the exemplary embodiment, the support structure may be inclined at an angle of 60° or less.

In the exemplary embodiment, the tilting shaft unit may extend on the first axis including the center of gravity of the support structure. According to the exemplary embodiment, a torque required for the driving device is reduced and thus the driving device may be easily controlled.

In another aspect, provided is a method of etching a multilayer film of a processing target using a plasma processing apparatus. The processing target includes an underlying layer, a lower magnetic layer provided on the underlying layer, an insulating layer provided on the lower magnetic layer, an upper magnetic layer provided on the insulating layer, and a mask provided on the upper magnetic layer. The plasma processing apparatus includes a processing container, a gas supply system that supplies a gas into the processing container, a high frequency power supply for plasma generation, and a support structure that supports a processing target. The method includes (a) step of etching the upper magnetic layer by plasma generated within the processing container (hereinafter, referred to as "step a"), the etching of the upper magnetic layer being terminated on the surface of the insulating layer, (b) step of removing a deposit formed on the surface of the mask and the upper magnetic layer by etching the upper magnetic layer, by the plasma generated within the processing container (hereinafter, referred to as "step b"), and (c) step of etching the insulating layer by the plasma generated within the processing container (hereinafter, referred to as "step c"). In step b of the method, the support structure that holds the processing target is inclined and rotated, and a pulse-modulated DC voltage as a bias voltage for ion attraction is applied to the support structure.

In the method, in step b, since the support structure is inclined, ions are incident onto the side surface of the upper magnetic layer and the side surface of the mask. Also, in step b, since the support structure is rotated, it is possible to cause ions to be incident toward the entire region of the side surface of the upper magnetic layer, and the entire region of the side surface of the mask. Also, the ions may be substantially uniformly incident within the plane of the processing target. Accordingly, it is possible to remove a deposit in the entire region of the side surface of the upper magnetic layer and the entire region of the side surface of the mask, thereby improving the perpendicularity of a shape formed in the upper magnetic layer. Also, the in-plane uniformity of the shape formed in the upper magnetic layer may be improved.

Also, in step b, as a bias voltage for ion attraction, a pulse-modulated DC voltage is used. According to the pulse-modulated DC voltage, it is possible to attract ions with relatively low energy and a narrow energy band to the processing target. Accordingly, a region constituted by specific substances (for example, a film or a deposit) may be selectively etched.

In step b of the exemplary embodiment, plasma of a rare gas having an atomic number larger than the atomic number of argon may be generated. Such a rare gas may be, for example, Kr (krypton) gas.

In the exemplary embodiment, the step a and the step b may be alternately repeated. According to the exemplary embodiment, before a large amount of deposit is formed, it is possible to remove the deposit.

In the exemplary embodiment, the pulse-modulated DC voltage has a period having a high level and a period having a low level in one cycle, and a duty ratio of the DC voltage, which is a ratio of the period having the high level in one cycle, may range from 10% to 90%.

In step a of the exemplary embodiment, plasma of a rare gas having an atomic number larger than the atomic number of argon may be generated, and a pulse-modulated DC voltage as a bias voltage for ion attraction may be applied to the support structure. The rare gas is, for example, Kr gas. According to the exemplary embodiment, it is possible to etch the upper magnetic layer while substantially not etching the insulating layer as an underlayer.

In step c of the exemplary embodiment, plasma of a rare gas having an atomic number larger than the atomic number of argon is generated, and a pulse-modulated DC voltage higher than the DC voltage applied to the support structure in the step of etching the upper magnetic layer or a high-frequency bias power is applied to the support structure. According to the exemplary embodiment, it is possible to etch the insulating layer using a bias voltage higher than a voltage set so as not to etch the insulating layer in step a.

In the exemplary embodiment, the method may further include (d) step of etching the lower magnetic layer by the plasma generated within the processing container, and (e) step of etching the underlying layer including a PtMn layer by the plasma generated within the processing container (hereinafter, referred to as "step e").

In step e of the exemplary embodiment, plasma of a rare gas may be generated, and a pulse-modulated DC voltage higher than the DC voltage applied to the support structure in the step of etching the upper magnetic layer or a high-frequency bias power may be applied to the support structure. According to the exemplary embodiment, it is possible to etch the lower magnetic layer including the PtMn layer using a bias voltage higher than a voltage set in step a.

The step e in the exemplary embodiment may include a step of setting the support structure to a non-inclined first state, and a step of setting the support structure to an inclined and rotary second state. According to the exemplary embodiment, a deposit formed by etching the lower magnetic layer may be removed.

The step e in the exemplary embodiment may include a first step of generating plasma of a processing gas containing a first rare gas having an atomic number larger than the atomic number of argon, and a second step of generating plasma of a processing gas containing a second rare gas having an atomic number smaller than the atomic number of argon. In the exemplary embodiment, in the first step and the second step, a high-frequency bias power may be supplied to the support structure. Plasma of a rare gas having an atomic number larger than the atomic number of argon, that is, a first rare gas, has a high sputtering efficiency, that is, an etching efficiency. Accordingly, the plasma of the first processing gas containing the first rare gas makes it possible to form a shape with higher perpendicularity than the plasma of a processing gas containing argon gas, so that a large amount of deposit may be removed. However, the plasma of the first processing gas is inferior in the selectivity with respect to the mask. Meanwhile, plasma of a rare gas having an atomic number smaller than the atomic number of argon, that is, a second rare gas, has a low sputtering efficiency, that is, an etching efficiency. Accordingly, the plasma of the second processing gas containing the second rare gas has a low etching efficiency. However, the plasma of the second processing gas is excellent in the selectivity with respect to the mask. According to the exemplary embodiment, in the first step, it is possible to improve the perpendicularity of a shape formed by etching, and reduce the deposit on the side wall surface of the shape. Also, in the second step, an etching selection ratio of a layer to be etched with respect to the mask may be improved. Accordingly, it is possible to perform etching that satisfies the removal of the deposit, the perpendicularity of the shape, and the selectivity with respect to the mask.

In the exemplary embodiment, in at least one of the first step and the second step, the support structure may be inclined and rotated. According to the embodiment, the deposit adhering to the side surface of the shape formed by etching may be more efficiently removed.

Effect of the Invention

As described above, it is possible to remove a deposit adhering to the surface of a shape formed by an etching, and selectively etch an etching target film with respect to a mask and an underlayer thereof.

DETAILED DESCRIPTION TO EXECUTE THE INVENTION

Hereinafter, various exemplary embodiments will be described in detail with reference to the accompanying drawings. Meanwhile, in the respective drawings, the same or corresponding parts will be denoted by the same symbols.

Figure 1:
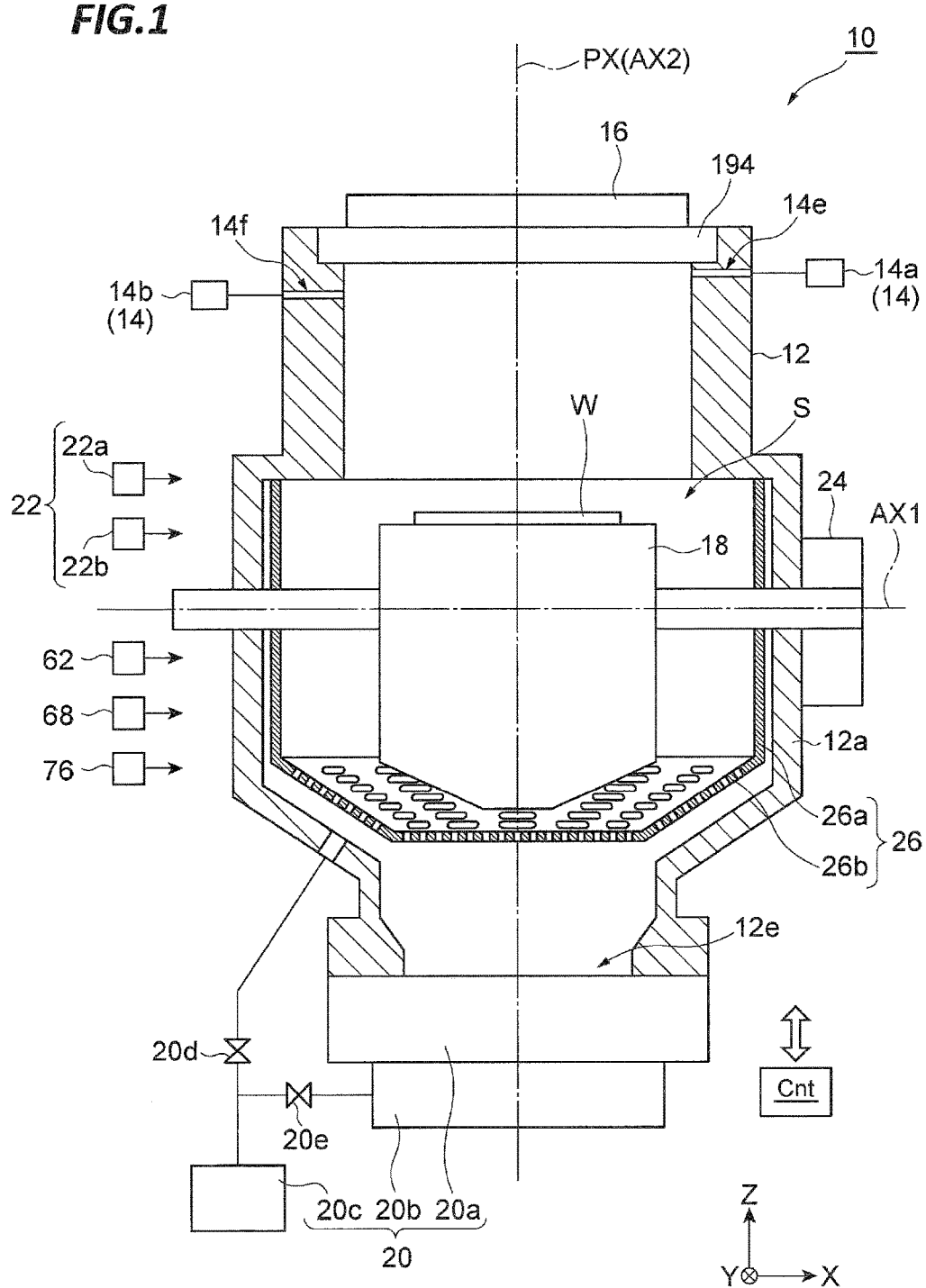
FIG. 1 is a view schematically illustrating a plasma processing apparatus according to an exemplary embodiment.
Figure 2:
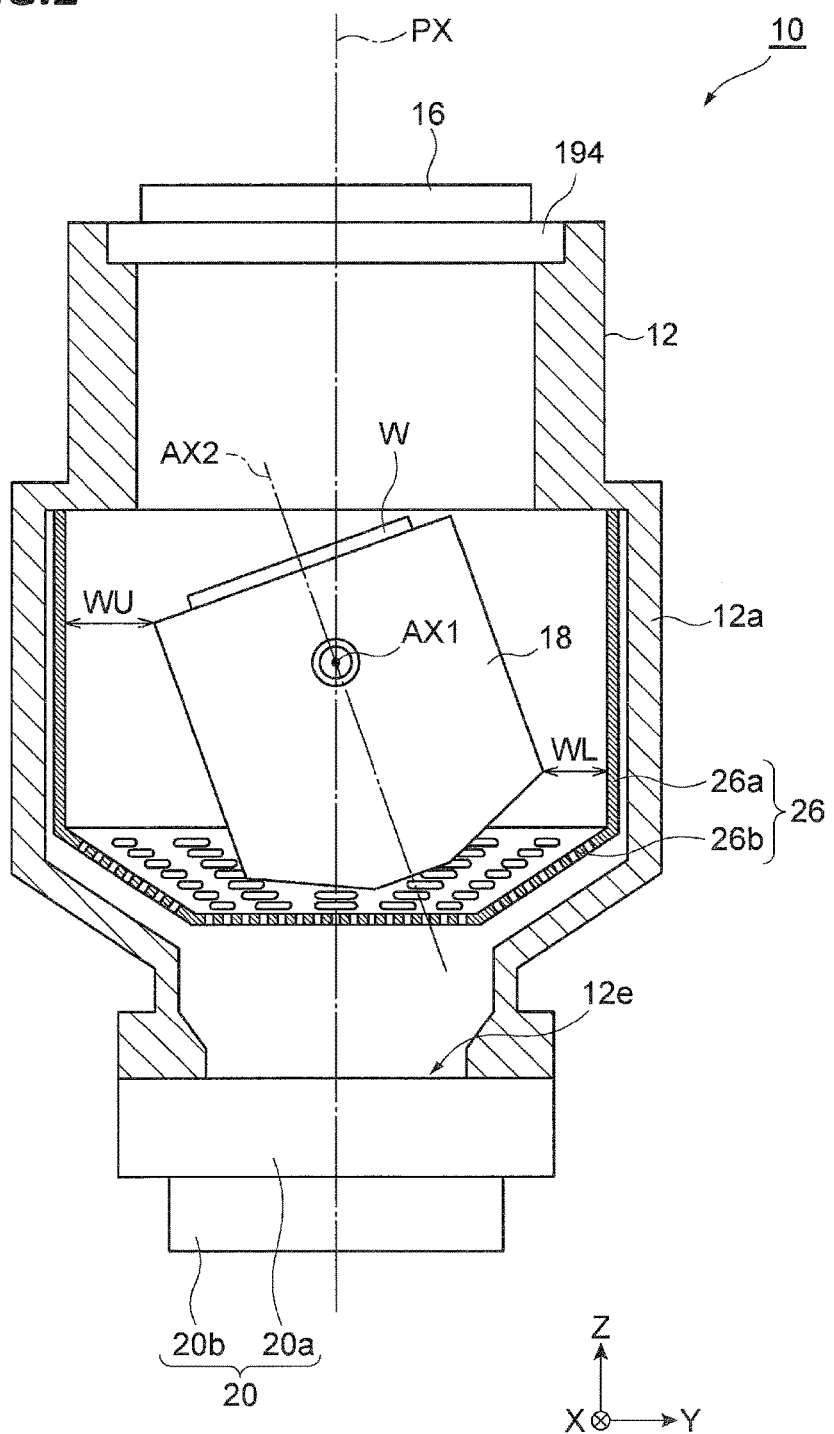
FIG. 2 is a view schematically illustrating a plasma processing apparatus according to the exemplary embodiment.

FIGS. 1 and 2 are views schematically illustrating a plasma processing apparatus according to an exemplary embodiment, in which the plasma processing apparatus is illustrated by a processing container broken in one plane including an axis PX extending in the vertical direction. Here, FIG. 1 illustrates a plasma processing apparatus in a state where a support structure to be described later is not inclined, and FIG. 2 illustrates a plasma processing apparatus in a state where a support structure is inclined.

A plasma processing apparatus 10 illustrated in FIGS. 1 and 2 includes a processing container 12, a gas supply system 14, a plasma source 16, a support structure 18, an exhaust system 20, a bias power supply unit 22, and a controller Cnt. The processing container 12 has a substantially cylindrical shape. In the exemplary embodiment, the central axis of the processing container 12 coincides with the axis PX. The processing container 12 provides a space S in which a plasma processing is to be performed on a processing target (hereinafter, referred to as "wafer W").

In the exemplary embodiment, the processing container 12 has a substantially constant width in a middle portion 12a in the height direction thereof, that is, a portion accommodating the support structure 18. The processing container 12 has a tapered shape in which the width gradually decreases from the lower end of the middle portion to a bottom portion. Also, the bottom portion of the processing container 12 provides an exhaust port 12e, and the exhaust port 12e is formed axially symmetrical with respect to the axis PX.

The gas supply system 14 is configured to supply a gas into the processing container 12. The gas supply system 14 includes a first gas supply unit 14a and a second gas supply unit 14b. The first gas supply unit 14a is configured to supply a first processing gas into the processing container 12. The second gas supply unit 14b is configured to supply a second processing gas into the processing container 12. Here, details of the gas supply system 14 will be described below.

The plasma source 16 is configured to excite a gas supplied into the processing container 12. In the exemplary embodiment, the plasma source 16 is provided in the ceiling of the processing container 12. In the exemplary embodiment, the central axis of the plasma source 16 coincides with the axis PX. Here, details of an example of the plasma source 16 will be described below.

The support structure 18 is configured to hold a wafer W within the processing container 12. The support structure 18 is configured to be rotatable about a first axis AX1 orthogonal to the axis PX. The support structure 18 may be inclined with respect to the axis PX by rotation around the first axis AX1. In order to tilt the support structure 18, the plasma processing apparatus 10 includes a driving device 24. The driving device 24 is provided outside the processing container 12, and generates a driving force for rotating the support structure 18 around the first axis AX1. Also, the support structure 18 is configured to rotate the wafer W around a second axis AX2 orthogonal to the first axis AX1. Here, in a state where the support structure 18 is not inclined, as illustrated in FIG. 1, the second axis AX2 coincides with the axis PX. Meanwhile, in a state where the support structure 18 is inclined, the second axis AX2 is inclined with respect to the axis PX. Details of the support structure 18 will be described later.

The exhaust system 20 is configured to reduce the pressure in the space within the processing container 12. In the exemplary embodiment, the exhaust system 20 includes an automatic pressure controller 20a, a turbo molecular pump 20b, and a dry pump 20c. The turbo molecular pump 20b is provided at the downstream of the automatic pressure controller 20a. The dry pump 20c is directly connected to the space within the processing container 12 through a valve 20d. Also, the dry pump 20c is provided at the downstream of the turbo molecular pump 20b through a valve 20e.

The exhaust system including the automatic pressure controller 20a and the turbo molecular pump 20b is attached to a bottom portion of the processing container 12. Also, the exhaust system including the automatic pressure controller 20a and the turbo molecular pump 20b is provided just below the support structure 18. Accordingly, in the plasma processing apparatus 10, a uniform exhaust flow may be formed from the periphery of the support structure 18 to the exhaust system 20. Accordingly, efficient exhaust may be achieved. Also, plasma generated within the processing container 12 may be uniformly diffused.

In the exemplary embodiment, a rectifying member 26 may be provided within the processing container 12. The rectifying member 26 has a substantially tubular shape with a closed lower end. The rectifying member 26 extends along an inner wall surface of the processing container 12 to surround the support structure 18 from the side and the lower side. In an example, the rectifying member 26 includes an upper portion 26a and a lower portion 26b. The upper portion 26a has a cylindrical shape with a fixed width, and extends along the inner wall surface of the middle portion 12a of the processing container 12. Also, the lower portion 26b is continuous from the upper portion 26a, below the upper portion 26a. The lower portion 26b has a tapered shape whose width gradually decreases along the inner wall surface of the processing container 12, and has a lower end formed in a flat plate shape. A large number of openings (through holes) are formed in the lower portion 26b. According to the rectifying member 26, a pressure difference may be formed between the inside of the rectifying member 26, that is, a space where the wafer W is accommodated, and the outside of the rectifying member 26, that is, an exhaust side space so that a gas staying time in the space where the wafer W is accommodated may be adjusted. Also, uniform exhaust may be achieved.

Figure 3:
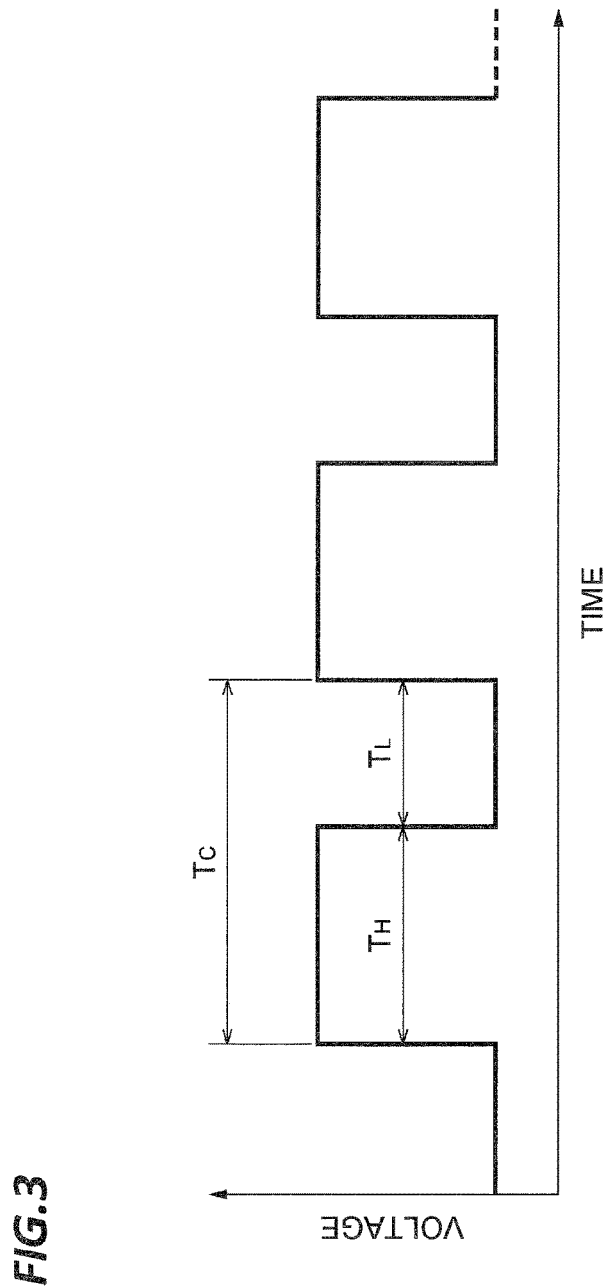
FIG. 3 is a view illustrating a pulse-modulated bias voltage.

The bias power supply unit 22 is configured to selectively apply a bias voltage and a high-frequency bias power for attracting ions to the wafer W, to the support structure 18. In the exemplary embodiment, the bias power supply unit 22 includes a first power supply 22a and a second power supply 22b. The first power supply 22a generates a pulse-modulated DC voltage (hereinafter, referred to as "modulated DC voltage") as a bias voltage to be applied to the support structure 18. FIG. 3 is a view illustrating a pulse-modulated DC voltage. As illustrated in FIG. 3, the modulated DC voltage is a voltage in which a period $T_H$ during which the voltage value has a high level and a period $T_L$ during which the voltage value has a low level are alternately repeated. The modulated DC voltage may be set to a voltage value ranging from, for example, 0 V to 1200 V. The high level voltage value of the modulated DC voltage is a voltage value set within the range of the voltage value, and the low level voltage value of the modulated DC voltage is a voltage value lower than the high level voltage value. As illustrated in FIG. 3, the sum of the period $T_H$ and the period $T_L$ subsequent to the period $T_H$ constitutes one cycle $T_c$. Also, the frequency of pulse modulation of the modulated DC voltage is $1/T_c$. The frequency of pulse modulation may be arbitrarily set, and is a frequency at which a sheath capable of accelerating ions may be formed, for example, 400 kHz. Also, an on-duty ratio, that is, the occupancy ratio of the period $T_H$ in one cycle $T_c$, ranges from 10% to 90%.

The second power supply 22b is configured to supply a high-frequency bias power for attracting ions to the wafer W, to the support structure 18. The frequency of the high-frequency bias power is an arbitrary frequency suitable for attracting ions to the wafer W, for example, 400 kHz. In the plasma processing apparatus 10, the modulated DC voltage from the first power supply 22a and the high-frequency bias power from the second power supply 22b may be selectively supplied to the support structure 18. The selective supplying of the modulated DC voltage and the high-frequency bias power may be controlled by the controller Cnt.

The controller Cnt is, for example, a computer including, a processor, a storage, an input device, a display device, and the like. The controller Cnt is operated according to a program based on an input recipe, and sends a control signal.

Respective units of the plasma processing apparatus 10 are controlled by the control signal sent from the controller Cnt.

Hereinafter, each of the gas supply system 14, the plasma source 16, and the support structure 18 will be described in detail.

[Gas Supply System]

The gas supply system 14 includes the first gas supply unit 14a and the second gas supply unit 14b as described above. The first gas supply unit 14a supplies a first processing gas into the processing container 12 through one or more gas ejecting holes 14e. Also, the second gas supply unit 14b supplies a second processing gas into the processing container 12 through one or more gas ejecting holes 14f. The gas ejecting holes 14e are provided at a position closer to the plasma source 16 than the gas ejecting holes 14f. Accordingly, the first processing gas is supplied to a position closer to the plasma source 16 than the second processing gas. Also, in FIGS. 1 and 2, the number of each of the gas ejecting hole 14e and the gas ejecting hole 14f is "1," but a plurality of gas ejecting holes 14e and a plurality of gas ejecting holes 14f may be formed. The plurality of gas ejecting holes 14e may be equally arranged in the circumferential direction relative to the axis PX. Also, the plurality of gas ejecting holes 14f may be equally arranged in the circumferential direction relative to the axis PX.

In the exemplary embodiment, a partition plate, a so-called ion trap may be provided between an area in which a gas is ejected by the gas ejecting hole 14e and an area in which a gas is ejected by the gas ejecting hole 14f. Accordingly, the amount of ions directed to the wafer W from the plasma of the first processing gas may be adjusted.

The first gas supply unit 14a may include one or more gas sources, one or more flow controllers, and one or more valves. Accordingly, the flow rate of the first processing gas supplied from one or more gas sources of the first gas supply unit 14a may be adjusted. Also, the second gas supply unit 14b may include one or more gas sources, one or more flow controllers, and one or more valves. Accordingly, the flow rate of the second processing gas supplied from one or more gas sources of the second gas supply unit 14b may be adjusted. The flow rate of the first processing gas supplied from the first gas supply unit 14a, and the supply timing of the first processing gas, and the flow rate of the second processing gas supplied from the second gas supply unit 14b, and the supply timing of the second processing gas, are individually adjusted by the controller Cnt.

Figure 4:
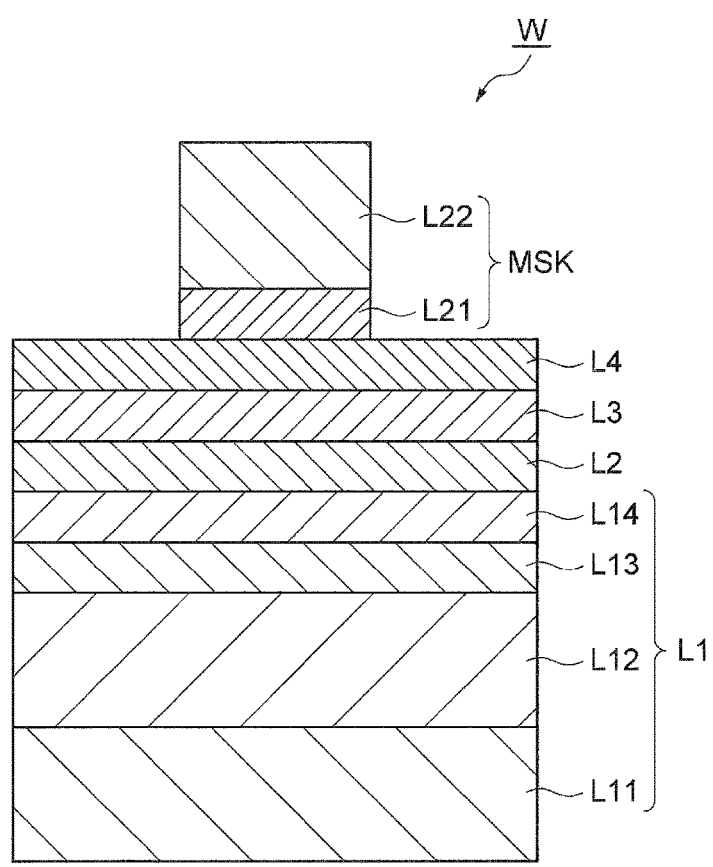
FIG. 4 is a sectional view illustrating an example of a processing target.

Hereinafter, three examples related to the first processing gas and the second processing gas will be described. In order to explain utilization modes of the first processing gas and the second processing gas according to the three examples, first, an example of a processing target will be described with reference to FIG. 4. FIG. 4 is a sectional view illustrating an example of a processing target. A wafer W illustrated in FIG. 4 is a processing target from which an MRAM device having an MTJ structure may be created, and includes a multilayer film that constitutes the MRAM device. Specifically, the wafer W includes an underlying layer L1, a lower magnetic layer L2, an insulating layer L3, an upper magnetic layer L4, and a mask MSK.

The underlying layer L1 includes a lower electrode layer L11, an antiferromagnetic layer L12, a ferromagnetic layer L13, and a non-magnetic layer L14. The lower electrode layer L11 may be made of, for example Ta. The antiferromagnetic layer L12 is provided on the lower electrode layer L11, and may be made of, for example, PtMn. That is, the underlying layer L1 may include a PtMn layer. The ferromagnetic layer L13 is provided on the antiferromagnetic layer L12, and may be made of, for example, CoFe. Also, the non-magnetic layer L14 is provided on the ferromagnetic layer L13, and may be made of, for example, Ru.

The lower magnetic layer L2, the insulating layer L3, and the upper magnetic layer L4 correspond to the multilayer film that forms the MTJ structure. The lower magnetic layer L2 is provided on the non-magnetic layer L14, and may be made of, for example, CoFeB. Here, the ferromagnetic layer L13, the non-magnetic layer L14, and the lower magnetic layer L2 constitute a magnetization fixed layer. The insulating layer L3 is provided between the lower magnetic layer L2 and the upper magnetic layer L4, and may be made of, for example, magnesium oxide (MgO). Also, the upper magnetic layer L4 is provided on the insulating layer L3, and may be made of, for example, CoFeB.

A mask MSK is provided on the upper magnetic layer L4. The mask MSK may include a first layer L21 and a second layer L22. The first layer L21 is provided on the upper magnetic layer L4, and may be made of, for example, Ta. The second layer L22 is provided on the first layer L21, and may be made of, for example, TiN. In the region of the wafer W not covered with the mask MSK, the multilayer film from the upper magnetic layer L4 to the antiferromagnetic layer L12 is etched. Hereinafter, three examples of the first processing gas and the second processing gas will be described by taking such a wafer W as an example.

In the first example, the first processing gas may be a rare gas. The rare gas is He gas, Ne gas, Ar gas, Kr gas, or Xe gas. Also, the first processing gas may be a gas selected from He gas, Ne gas, Ar gas, Kr gas, and Xe gas. For example, when the multilayer film of the wafer W illustrated in FIG. 4 is etched using the plasma processing apparatus 10, a rare gas suitable for etching each layer is selected.

Also, in the first example, the second processing gas may be a hydrogen-containing gas. As the hydrogen-containing gas, $CH_4$ gas or $NH_3$ gas is exemplified. The active species of hydrogen derived from such a second processing gas reforms a substance included in the multilayer film, that is, a metal, into a state where the substrate may be easily etched due to a reducing action. Also, carbon contained in $CH_4$ gas, or nitrogen contained in $NH_3$ gas combines with a material constituting the mask MSK to form a metal compound. Accordingly, the mask MSK is strengthened so that the etching rate of the mask MSK is reduced as compared to the etching rate of the multilayer film. As a result, it is possible to improve the selectivity of etching of a layer constituting the multilayer film other than the mask MSK in the wafer W.

In such a first example, the first processing gas and the second processing gas may be excited by the plasma source 16. In the first example, under the control by the controller Cnt, the supply amounts of the first processing gas and the second processing gas at the time of plasma generation are individually controlled.

In the second example, the first processing gas may be a decomposable gas dissociated by plasma generated by the plasma source 16 to generate radicals. The radicals derived from the first processing gas may be radicals that cause a reduction reaction, an oxidation reaction, a chlorination reaction, or a fluorination reaction. The first processing gas may be a gas containing a hydrogen element, an oxygen element, a chlorine element, or a fluorine element. Specifically, the first processing gas may be, for example, Ar, $N_2$, $O_2$, $H_2$, He, $BCl_3$, $Cl_2$, $CF_4$, $NF_3$, $CH_4$, or $SF_6$. As the first processing gas for generating the radicals of the reduction reaction, $H_2$ and the like are exemplified. As the first processing gas for generating the radicals of the oxidation reaction, $O_2$ and the like are exemplified. As the first processing gas for generating the radicals of the chlorination reaction, $BCl_3$, $Cl_2$, and the like are exemplified. As the first processing gas for generating the radicals of the fluorination reaction, $CF_4$, $NF_3$, $SF_6$, and the like are exemplified.

In the second example, the second processing gas may be a gas that reacts with a substance to be etched without being exposed to plasma. The second processing gas may contain, for example, a gas that reacts with a substance to be etched depending on the temperature of the support structure 18. Specifically, as such a second processing gas, for example, HF, $Cl_2$, HCl, $H_2O$, $PF_3$, $F_2$, $ClF_3$, $COF_2$, cyclopentadiene, or Amidinato is used. Also, the second processing gas may contain an electron donating gas. The electron donating gas generally refers to a gas composed of atoms which are highly different in an electronegativity or an ionization potential, or a gas containing an atom having a lone pair. The electron donating gas has a property of easily giving electrons to other compounds. For example, the electron donating gas has a property of binding with, for example, a metal compound, as a ligand and evaporating. As the electron donating gas, $SF_6$, $PH_3$, $PF_3$, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, $H_2O_2$ and the like, and a gas containing a carbonyl group are exemplified.

The first processing gas and the second processing gas in the second example may be used for removing deposit generated by etching of the multilayer film of the wafer W illustrated in FIG. 4. Specially, the deposit is reformed by radicals derived from the first processing gas, and then the reformed deposit reacts with the second processing gas. Accordingly, the deposit may be easily exhausted. In such a second example, the first processing gas and the second processing gas may be alternately supplied. When the first processing gas is supplied, plasma is generated by the plasma source 16, and when the second processing gas is supplied, plasma generation by the plasma source 16 is stopped. The supply of the first processing gas and the second processing gas is controlled by the controller Cnt. That is, in the second example, the supply amounts of the first processing gas and the second processing gas according to the status of plasma at the time of plasma generation and at the time of plasma extinction may be determined by controlling the first gas supply unit 14a and the second gas supply unit 14b by the controller Cnt.

[Plasma Source]

Figure 5:
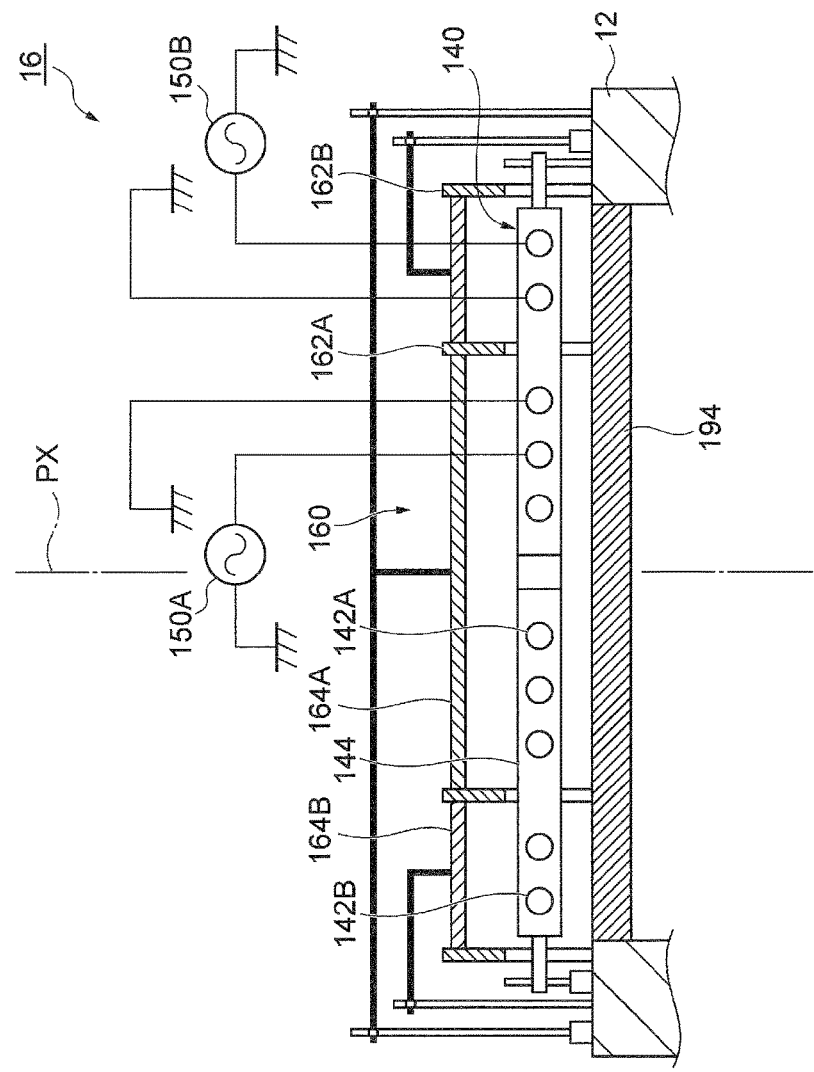
FIG. 5 is a view illustrating a plasma source of the exemplary embodiment.
Figure 6:
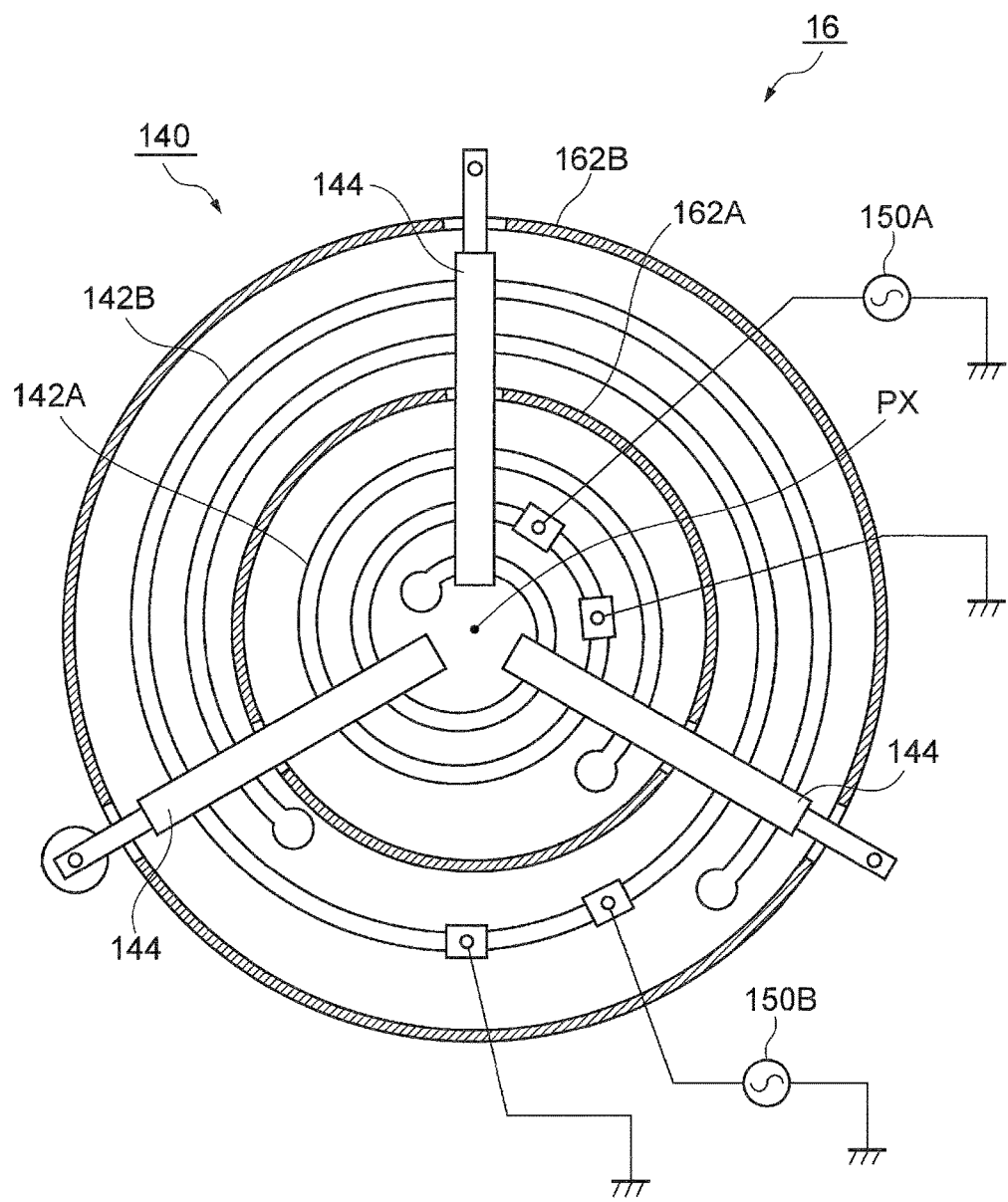
FIG. 6 is a view illustrating the plasma source of the exemplary embodiment.

FIG. 5 is a view illustrating a plasma source according to the exemplary embodiment, that is, a view illustrating the plasma source when viewed in the Y direction in FIG. 1. Also, FIG. 6 is a view illustrating a plasma source according to the exemplary embodiment, which illustrates the plasma source when viewed in a vertical direction. As illustrated in FIGS. 1 and 5, an opening is formed in the ceiling of the processing container 12, and the opening is closed by a dielectric plate 194. The dielectric plate 194 is a plate-like body, and is made of quartz glass or ceramic. The plasma source 16 is provided on the dielectric plate 194.

More specifically, as illustrated in FIGS. 5 and 6, the plasma source 16 includes a high frequency antenna 140 and a shield member 160. The high frequency antenna 140 is covered with the shield member 160. In the exemplary embodiment, the high frequency antenna 140 includes an inner antenna element 142A and an outer antenna element 142B. The inner antenna element 142A is provided closer to the axis PX than the outer antenna element 142B. That is, the outer antenna element 142B is provided outside the inner antenna element 142A to surround the inner antenna element 142A. Each of the inner antenna element 142A and the outer antenna element 142B is made of, for example, a conductor such as, for example, copper, aluminum, or stainless steel, and extends spirally around the axis PX.

Both the inner antenna element 142A and the outer antenna element 142B are held by a plurality of holding members 144 and then integrated. The plurality of holding members 144 are, for example, rod-shaped members, and disposed radially with respect to the axis PX.

The shield member 160 includes an inner shield wall 162A and an outer shield wall 162B. The inner shield wall 162A has a cylindrical shape extending in the vertical direction, and is provided between the inner antenna element 142A and the outer antenna element 142B. The inner shield wall 162A surrounds the inner antenna element 142A. Also, the outer shield wall 162B has a cylindrical shape extending in the vertical direction, and is provided to surround the outer antenna element 142B.

An inner shield plate 164A is provided above the inner antenna element 142A. The inner shield plate 164A has a disk shape, and is provided to close the opening of the inner shield wall 162A. Also, an outer shield plate 164B is provided above the outer antenna element 142B. The outer shield plate 164B is an annular plate, and is provided to close the opening between the inner shield wall 162A and the outer shield wall 162B.

A high frequency power supply 150A, and a high frequency power supply 150B are connected to the inner antenna element 142A, and the outer antenna element 142B, respectively. The high frequency power supply 150A and the high frequency power supply 150B are high frequency power supplies for generating plasma. The high frequency power supply 150A and the high frequency power supply 150B supply high frequency powers with the same frequency or different frequencies to the inner antenna element 142A and the outer antenna element 142B, respectively. For example, when the high frequency power of a predetermined frequency (e.g., 40 MHz) is supplied with a predetermined power to the inner antenna element 142A from the high frequency power supply 150A, the processing gas introduced into the processing container 12 is excited by the induction magnetic field formed within the processing container 12 to generate a donut-shaped plasma in the central portion on the wafer W. Also, when the high frequency power of a predetermined frequency (e.g., 60 MHz) is supplied with a predetermined power to the outer antenna element 142B from the high frequency power supply 150B, the processing gas introduced into the processing container 12 is excited by the induction magnetic field formed within the processing container 12 to generate another donut-shaped plasma in the peripheral portion on the wafer W. By these plasmas, radicals are generated from the processing gases.

Meanwhile, the frequency of the high frequency power output from the high frequency power supply 150A or the high frequency power supply 150B is not limited to the above-described frequency. For example, the frequency of the high frequency power output from the high frequency power supply 150A or the high frequency power supply 150B may be various frequencies such as 13.56 MHz, 27 MHz, 40 MHz, and 60 MHz. Meanwhile, it is necessary to adjust an electrical length of the inner antenna element 142A and the outer antenna element 142B according to high frequencies output from the high frequency power supply 150A and the high frequency power supply 150B.

The plasma source 16 may ignite plasma of the processing gas under a pressure environment of 1 mTorr (0.1333 Pa). Under the low pressure environment, a mean free path of ions in the plasma increases. Accordingly, etching may be made by sputtering of ions of a rare gas atom. Also, under the low pressure environment, an etched-off substance may be suppressed from adhering again to the wafer W while being exhausted.

[Support Structure]

Figure 7:
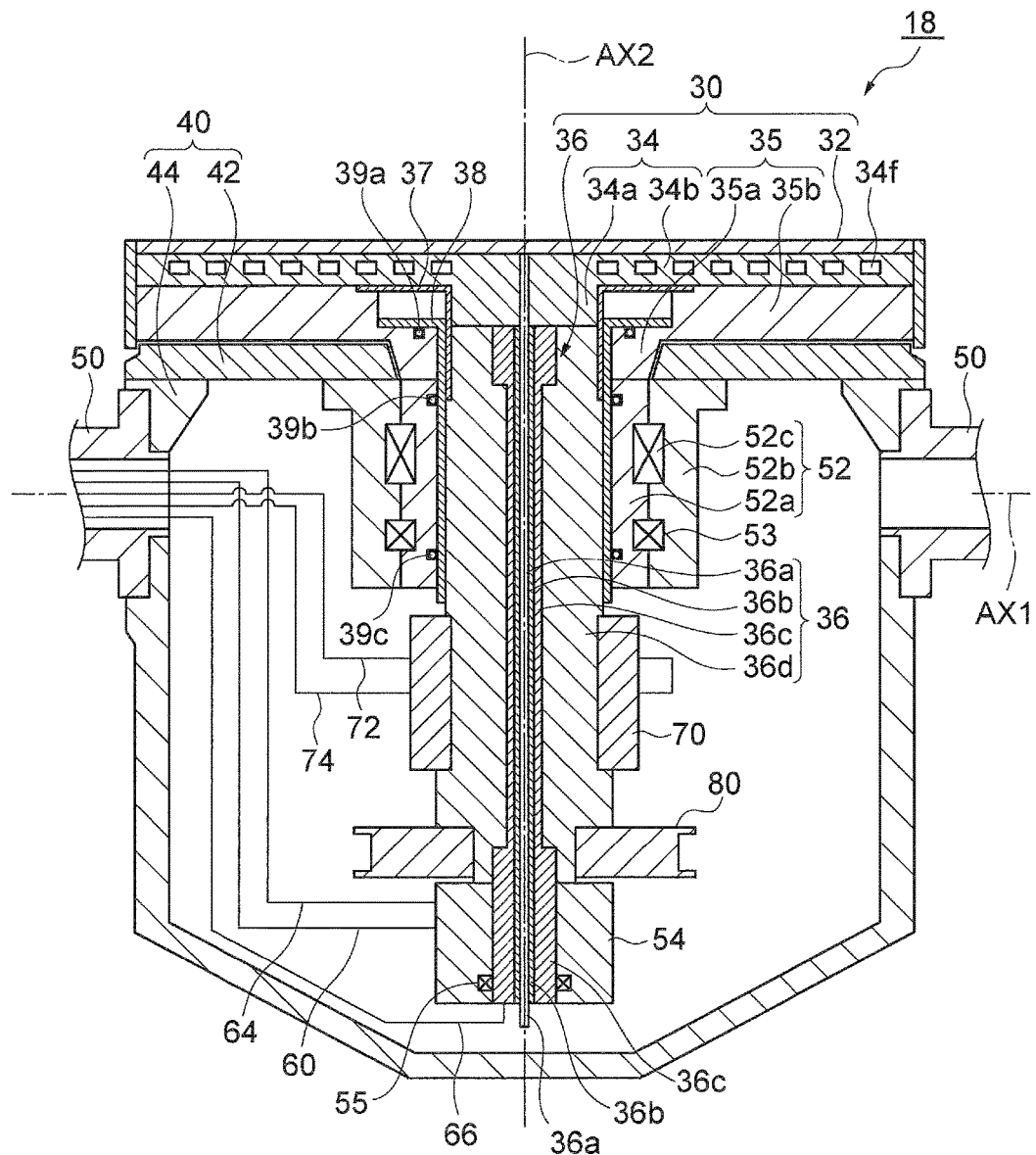
FIG. 7 is a sectional view illustrating a support structure according to the exemplary embodiment.
Figure 8:
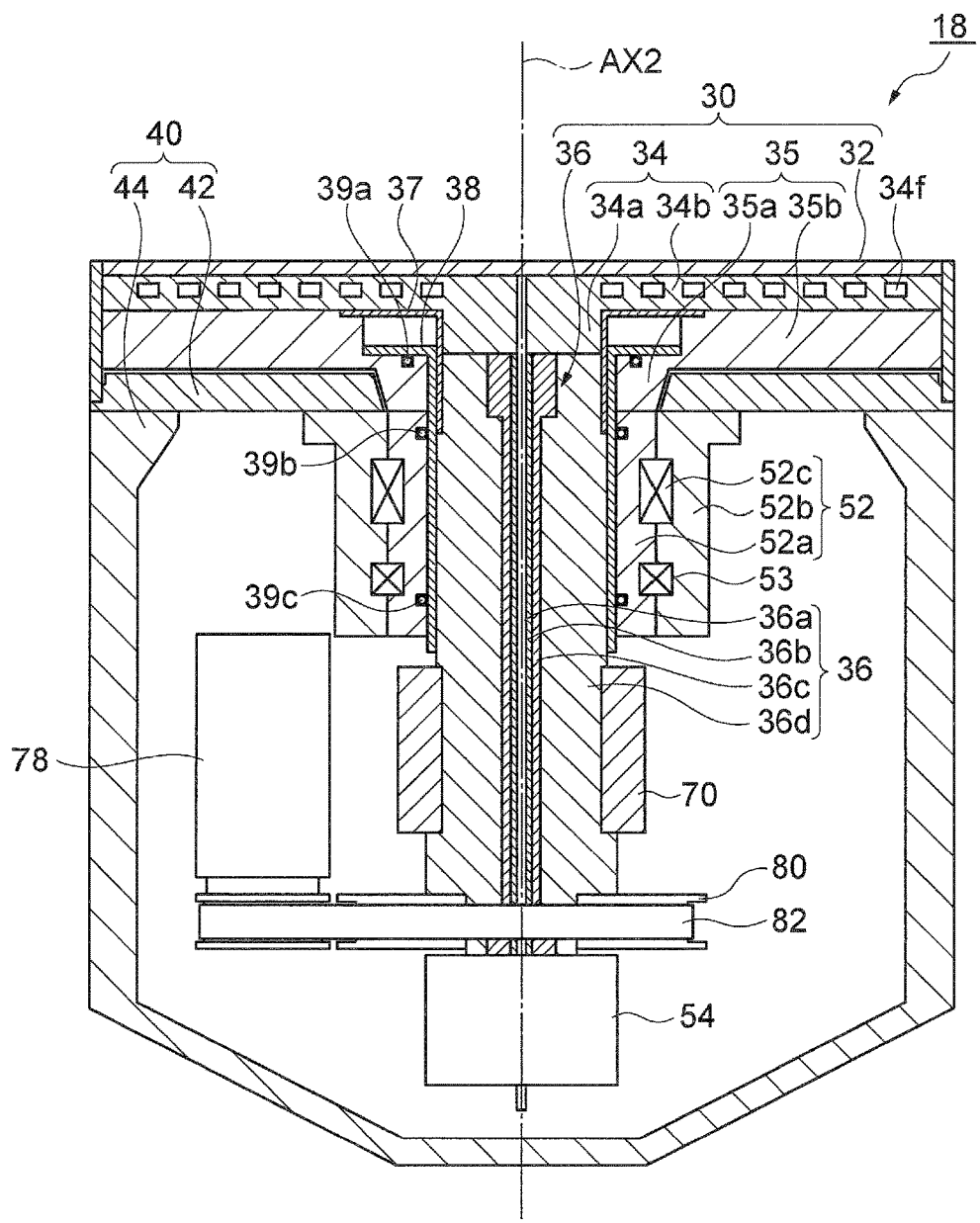
FIG. 8 is a sectional view illustrating the support structure according to the exemplary embodiment.

FIGS. 7 and 8 are sectional views illustrating a support structure according to the exemplary embodiment. FIG. 7 illustrates a sectional view of the support structure when viewed in the Y direction (see, e.g., FIG. 1), and FIG. 8 illustrates a sectional view of the support structure when viewed in the X direction (see, e.g., FIG. 1). As illustrated in illustrated in FIGS. 7 and 8, the support structure 18 includes a holding unit 30, a container unit 40, and a tilting shaft unit 50.

The holding unit 30 is a mechanism that holds the wafer W and rotates the wafer W by rotating around the second axis AX2. Also, as described above, in a state where the support structure 18 is not inclined, the second axis AX2 coincides with the axis PX. The holding unit 30 includes an electrostatic chuck 32, a lower electrode 34, a rotating shaft unit 36, and an insulating member 35.

The electrostatic chuck 32 is configured to hold the wafer W on the top surface thereof. The electrostatic chuck 32 has substantially a disk shape centering around the second axis AX2, and includes an electrode film provided as an inner layer of an insulating film. The electrostatic chuck 32 generates an electrostatic force when a voltage is applied to the electrode film. Due to the electrostatic force, the electrostatic chuck 32 attracts the wafer W placed on the top surface thereof. A heat transfer gas such as He gas is supplied to a gap between the electrostatic chuck 32 and the wafer W. Also, a heater for heating the wafer W may be embedded in the electrostatic chuck 32. The electrostatic chuck 32 is provided on the lower electrode 34.

The lower electrode 34 has substantially a disk shape centering around the second axis AX2. In the exemplary embodiment, the lower electrode 34 includes a first portion 34a and a second portion 34b. The first portion 34a is a portion of the lower electrode 34 at the center side, which extends along the second axis AX2, and the second portion 34b is a portion farther from the second axis AX2 than the first portion 34a, that is, a portion extending at the outside of the first portion 34a. The top surface of the first portion 34a and the top surface of the second portion 34b are continuous, and a substantially flat top surface of the lower electrode 34 is constituted by the top surface of the first portion 34a and the top surface of the second portion 34b. The electrostatic chuck 32 is in contact with the top surface of the lower electrode 34. Also, the first portion 34a protrudes downward from the second portion 34b and has a cylindrical shape. That is, the bottom surface of the first portion 34a extends below the bottom surface of the second portion 34b. The lower electrode 34 is made of a conductor such as aluminum. The lower electrode 34 is electrically connected to the above described bias power supply unit 22. That is, the modulated DC voltage from the first power supply 22a and the high-frequency bias power from the second power supply 22b are selectively supplied to the lower electrode 34. Also, a refrigerant flow path 34f is provided in the lower electrode 34. A refrigerant is supplied to the refrigerant flow path 34f so as to control the temperature of the wafer W. The lower electrode 34 is provided on the insulating member 35.

The insulating member 35 is made of an insulator such as, for example, quartz' or alumina, and has substantially a disc shape with an opened center. In the exemplary embodiment, the insulating member 35 includes a first portion 35a and a second portion 35b. The first portion 35a is a portion of the insulating member 35 at the center side, and the second portion 35b is a portion farther from the second axis AX2 than the first portion 35a, that is, a portion extending at the outside of the first portion 35a. The top surface of the first portion 35a extends below the top surface of the second portion 35b, and also, the bottom surface of the first portion 35a extends below the bottom surface of the second portion 35b. The top surface of the second portion 35b of the insulating member 35 is in contact with the bottom surface of the second portion 34b of the lower electrode 34. Meanwhile, the top surface of the first portion 35a of the insulating member 35 is spaced apart from the bottom surface of the lower electrode 34.

The rotating shaft unit 36 has a substantially cylindrical shape, and is coupled to the bottom surface of the lower electrode 34, and specifically, coupled to the bottom surface of the first portion 34a of the lower electrode 34. The central axis of the rotating shaft unit 36 coincides with the second axis AX2. By applying a rotational force to the rotating shaft unit 36, the holding unit 30 is rotated.

The holding unit 30 constituted by such various elements forms a hollow space as an internal space of the support structure 18, together with the container unit 40. The container unit 40 includes an upper container part 42 and an outer container part 44. The upper container part 42 has substantially a disk shape. A through hole through which the rotating shaft unit 36 passes is formed at the center of the upper container part 42. The upper container part 42 is provided below the second portion 35b of the insulating member 35 so as to provide a slight gap with respect to the second portion 35b. Also, the upper end of the outer container part 44 is coupled to a peripheral portion of the bottom surface of the upper container part 42. The outer container part 44 has a substantially cylindrical shape with a closed lower end.

A magnetic fluid seal unit 52 is provided between the container unit 40 and the rotating shaft unit 36. The magnetic fluid seal unit 52 includes an inner ring unit 52a and an outer ring unit 52b. The inner ring unit 52a has a substantially cylindrical shape extending coaxially with the rotating shaft unit 36, and is fixed to the rotating shaft unit 36. Also, the upper end portion of the inner ring unit 52a is coupled to the bottom surface of the first portion 35a of the insulating member 35. The inner ring unit 52a is configured to rotate together with the rotating shaft unit 36 around the second axis AX2. The outer ring unit 52b has a substantially cylindrical shape, and is provided coaxially with the inner ring unit 52a at the outer side of the inner ring unit 52a. The upper end portion of the outer ring unit 52b is coupled to the bottom surface of the central side portion of the upper container part 42. A magnetic fluid 52c is interposed between the inner ring unit 52a and the outer ring unit 52b. Also, a bearing 53 is provided between the inner ring unit 52a and the outer ring unit 52b below the magnetic fluid 52c. The magnetic fluid seal unit 52 provides a sealing structure of hermetically sealing the internal space of the support structure 18. By the magnetic fluid seal unit 52, the internal space of the support structure 18 is separated from the space S of the plasma processing apparatus 10. Here, in the plasma processing apparatus 10, the internal space of the support structure 18 is maintained at atmosphere pressure.

In the exemplary embodiment, a first member 37 and a second member 38 are provided between the magnetic fluid seal unit 52 and the rotating shaft unit 36. The first member 37 has a substantially cylindrical shape extending along a part of an outer peripheral surface of the rotating shaft unit 36, that is, the outer peripheral surface of the upper portion of a third cylindrical portion 36d to be described below, and the outer peripheral surface of the first portion 34a of the lower electrode 34. Also, the upper end of the first member 37 has an annular plate shape extending along the bottom surface of the second portion 34b of the lower electrode 34. The first member 37 is in contact with the outer peripheral surface of the upper portion of the third cylindrical portion 36d, the outer peripheral surface of the first portion 34a of the lower electrode 34, and the bottom surface of the second portion 34b.

The second member 38 has a substantially cylindrical shape extending along the outer peripheral surface of the rotating shaft unit 36, that is, the outer peripheral surface of the third cylindrical portion 36d, and the outer peripheral surface of the first member 37. The upper end of the second member 38 has an annular plate shape extending along the top surface of the first portion 35a of the insulating member 35. The second member 38 is in contact with the outer peripheral surface of the third cylindrical portion 36d, the outer peripheral surface of the first member 37, the top surface of the first portion 35a of the insulating member 35, and the inner peripheral surface of the inner ring unit 52a of the magnetic fluid seal unit 52. A sealing member 39a such as an O-ring is interposed between the second member 38 and the top surface of the first portion 35a of the insulating member 35. Also, sealing members 39b and 39c such as O-rings are interposed between the second member 38 and the inner peripheral surface of the inner ring unit 52a of the magnetic fluid seal unit 52. By such a structure, a gap between the rotating shaft unit 36 and the inner ring unit 52a of the magnetic fluid seal unit 52 is sealed. Accordingly, even when a gap is present between the rotating shaft unit 36 and the magnetic fluid seal unit 52, the internal space of the support structure 18 is separated from the space S of the plasma processing apparatus 10.

An opening is formed in the outer container part 44 along the first axis AX1. An inner end portion of the tilting shaft unit 50 is fitted into the opening formed in the outer container part 44. The tilting shaft unit 50 has a substantially cylindrical shape, and the central axis thereof coincides with the first axis AX1. The tilting shaft unit 50, as illustrated in FIG. 1, extends to the outside of the processing container 12. One outer end portion of the tilting shaft unit 50 is coupled with the above described driving device 24. The driving device 24 pivotally supports one outer end portion of the tilting shaft unit 50. When the tilting shaft unit 50 is rotated by the driving device 24, the support structure 18 rotates around the first axis AX1 so that the support structure 18 is inclined with respect to the axis PX. For example, the support structure 18 may be inclined such that the second axis AX2 forms an angle within a range of 0° to 60° with respect to the axis PX.

In the exemplary embodiment, the first axis AX1 includes the center position of the support structure 18 in the direction of the second axis AX2. In the exemplary embodiment, the tilting shaft unit 50 extends on the first axis AX1 passing through the center of the support structure 18. In the exemplary embodiment, it is possible to increase the minimum distance among the shortest distance WU (see, e.g., FIG. 2) between the upper edge of the support structure 18 and the processing container 12 (or the rectifying member 26), and the shortest distance WL (see, e.g., FIG. 2) between the lower edge of the support structure 18 and the processing container 12 (or the rectifying member 26) when the support structure 18 is inclined. That is, the minimum distance between the outline of the support structure 18 and the processing container 12 (or the rectifying member 26) may be maximized. Accordingly, it is possible to decrease the width of the processing container 12 in the horizontal direction.

In another exemplary embodiment, the first axis AX1 includes a position between the center of the support structure 18 in the direction of the second axis AX2, and the top surface of the holding unit 30. That is, in the exemplary embodiment, the tilting shaft unit 50 extends at a position biased toward the holding unit 30 rather than the center of the support structure 18. According to the present exemplary embodiment, when the support structure 18 is inclined, a difference in a distance from the plasma source 16 to each position of the wafer W may be reduced. Accordingly, the in-plane uniformity of etching is further improved. Also, the support structure 18 may be inclined at an angle of 60° or less.

In a further exemplary embodiment, the first axis AX1 includes the center of gravity of the support structure 18. In the exemplary embodiment, the tilting shaft unit 50 extends on the first axis AX1 including the center of gravity. According to the exemplary embodiment, a torque required for the driving device 24 is reduced and thus the driving device 24 may be easily controlled.

Referring back to FIGS. 7 and 8, wirings for various electrical systems, a pipe for a heat transfer gas, and a pipe for a refrigerant pass through the inner hole of the tilting shaft unit 50. The wirings and pipes are connected to the rotating shaft unit 36.

The rotating shaft unit 36 includes a columnar portion 36a, a first cylindrical portion 36b, a second cylindrical portion 36c, and a third cylindrical portion 36d. The columnar portion 36a has a substantially cylindrical shape, and extends on the second axis AX2. The columnar portion 36a is a wiring for applying a voltage to the electrode film of the electrostatic chuck 32. The columnar portion 36a is connected to a wiring 60 through a rotary connector 54 such as a slip ring. The wiring 60 extends from the inner space of the support structure 18 to the outside of the processing container 12 through the inner hole of the tilting shaft unit 50. The wiring 60 is connected to a power supply 62 (see, e.g., FIG. 1) through a switch at the outside of the processing container 12.

The first cylindrical portion 36b is provided coaxially with the columnar portion 36a at the outside of the columnar portion 36a. The first cylindrical portion 36b is a wiring for supplying a modulated DC voltage and a high-frequency bias power to the lower electrode 34. The first cylindrical portion 36b is connected to a wiring 64 through the rotary connector 54. The wiring 64 extends from the inner space of the support structure 18 to the outside of the processing container 12 through the inner hole of the tilting shaft unit 50. The wiring 64 is connected to the first power supply 22a and the second power supply 22b of the bias power supply unit 22 at the outside of the processing container 12. Also, a matching unit for impedance matching may be provided between the second power supply 22b and the wiring 64.

The second cylindrical portion 36c is provided coaxially with the first cylindrical portion 36b at the outside of the first cylindrical portion 36b. In the exemplary embodiment, a bearing 55 is provided in the above described rotary connector 54. The bearing 55 extends along the outer peripheral surface of the second cylindrical portion 36c. The bearing 55 supports the rotating shaft unit 36 through the second cylindrical portion 36c. The above described bearing 53 supports the upper portion of the rotating shaft unit 36 while the bearing 55 supports the lower portion of the rotating shaft unit 36. In this manner, since both the upper portion and the lower portion of the rotating shaft unit 36 are supported by the two bearings 53 and 55, the rotating shaft unit 36 may be stably rotated around the second axis AX2.

A gas line for supplying a heat transfer gas is formed in the second cylindrical portion 36c. The gas line is connected to a pipe 66 through a rotary joint such as a swivel joint. The pipe 66 extends from the inner space of the support structure 18 to the outside of the processing container 12 through the inner hole of the tilting shaft unit 50. The pipe 66 is connected to a heat transfer gas source 68 (see, e.g., FIG. 1) at the outside of the processing container 12.

The third cylindrical portion 36d is provided coaxially with the second cylindrical portion 36c at the outside of the second cylindrical portion 36c. A refrigerant supply line for supplying a refrigerant to the refrigerant flow path 34f and a refrigerant recovery line for recovering the refrigerant supplied to the refrigerant flow path 34f are formed in the third cylindrical portion 36d. The refrigerant supply line is connected to a pipe 72 through a rotary joint 70 such as a swivel joint. Also, the refrigerant recovery line is connected to a pipe 74 through the rotary joint 70. The pipe 72 and the pipe 74 extend from the inner space of the support structure 18 to the outside of the processing container 12 through the inner hole of the tilting shaft unit 50. Also, the pipe 72 and the pipe 74 are connected to a chiller unit 76 (see, e.g., FIG. 1) at the outside of the processing container 12.

Also, as illustrated in FIG. 8, a rotary motor 78 is provided in the inner space of the support structure 18. The rotary motor 78 generates a driving force for rotating the rotating shaft unit 36. In the exemplary embodiment, the rotary motor 78 is provided at the side of the rotating shaft unit 36. The rotary motor 78 is connected to a pulley 80 attached to the rotating shaft unit 36 via a conduction belt 82. Accordingly, a rotational driving force of the rotary motor 78 is transferred to the rotating shaft unit 36, so that the holding unit 30 rotates around the second axis AX2. The number of revolutions of the holding unit 30 is within a range of, for example, 48 rpm or less. For example, the holding unit 30 is rotated at the number of revolutions of 20 rpm during the process. Also, a wiring for supplying a power to the rotary motor 78 is drawn to the outside of the processing container 12 through the inner hole of the tilting shaft unit 50 so as to be connected to a motor power supply provided outside the processing container 12.

In the support structure 18 as described above, various mechanisms may be provided in the inner space that may be maintained at the atmospheric pressure. Also, the support structure 18 is configured such that wirings or pipes that connect the mechanisms accommodated in the inner space of the support structure 18 to devices, such as a power supply, a gas source, and a chiller unit, provided outside the processing container 12 may be drawn to the outside of the processing container 12. Also, in addition to the wirings and pipes as described above, a wiring that connects a heater power supply provided outside the processing container 12 to a heater provided in the electrostatic chuck 32 may be drawn from the inner space of the support structure 18 to the outside of the processing container 12 through the inner hole of the tilting shaft unit 50.

Figure 9:
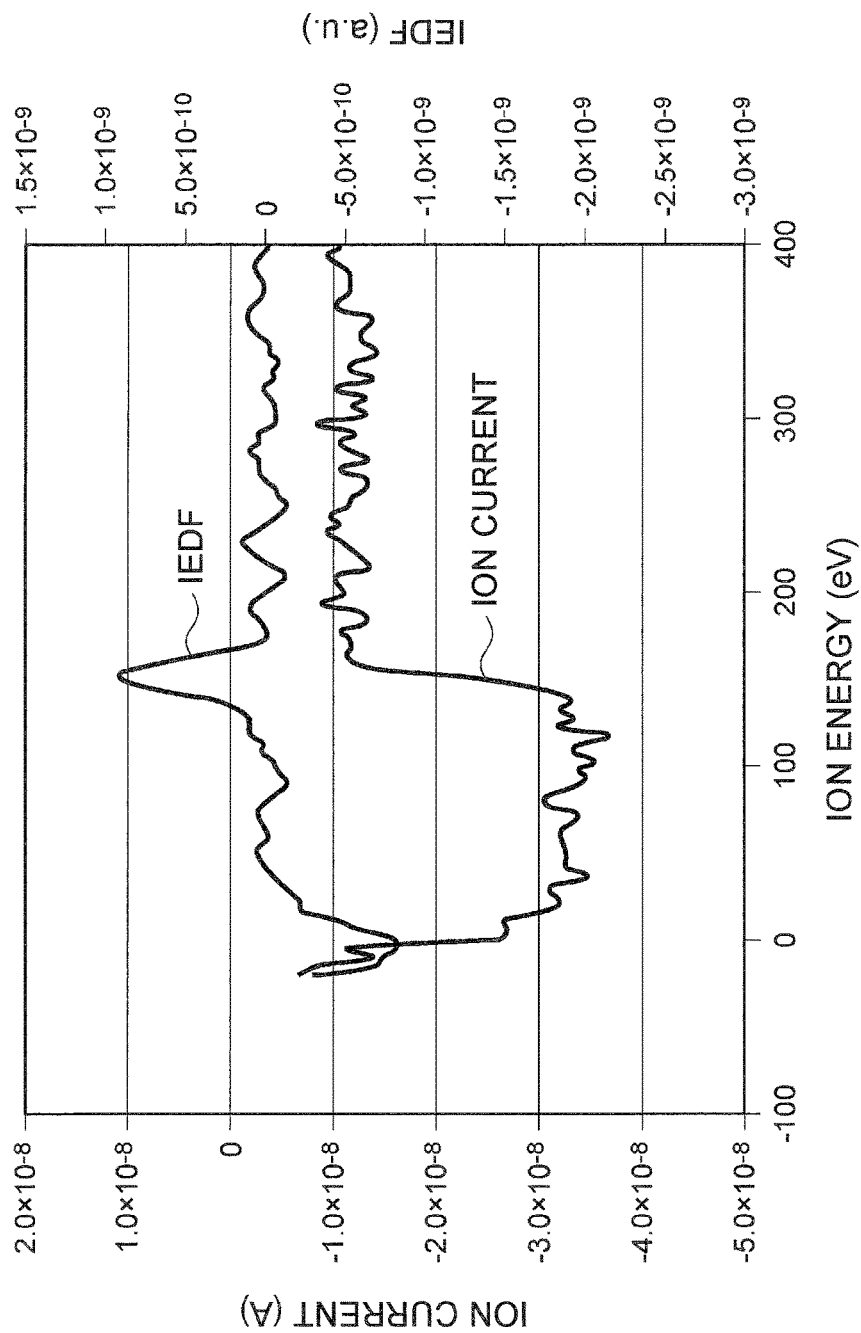
FIG. 9 is a graph illustrating a result when ion energy in the plasma processing apparatus illustrated in FIG. 1 was actually measured using an ion energy analyzer.

Hereinafter, an actual measurement result of ion energy in the plasma processing apparatus 10 will be described. FIG. 9 is a graph illustrating a result when ion energy in the plasma processing apparatus illustrated in FIG. 1 was actually measured using an ion energy analyzer. The ion energy illustrated in FIG. 9 was actually measured using the ion energy analyzer when plasma was generated under the following conditions.

<Conditions>
Processing gas: Kr gas, 50 sccm
Pressure within processing container 12: 5 mTorr (0.1333 Pa)
Power of high frequency power supply 150A and high frequency power supply 150B: 50 W
Voltage value of modulated DC voltage: 200 V
Modulation frequency of modulated DC voltage: 400 kHz
On-duty ratio of modulated DC voltage: 50%

The horizontal axis in FIG. 9 indicates ion energy, the left vertical axis indicates an ion current, and the right vertical axis indicates ion energy distribution function (IEDF), that is, the ion count number. As illustrated in FIG. 9, when the ion energy was actually measured under the above described conditions, ions having a narrow energy band centered on about 153.4 eV were generated. Accordingly, it is found that it is possible to cause ions having a narrow energy band and a relatively low energy to be incident on a wafer W by generating plasma of a rare gas and using a modulated DC voltage for ion attraction in the plasma processing apparatus 10.

Meanwhile, when instead of the modulated DC voltage, a high-frequency bias power of the second power supply 22b is supplied to the support structure 18, the ion energy becomes larger than 600 eV even if the magnitude of the high-frequency bias power is adjusted.

Figure 10:
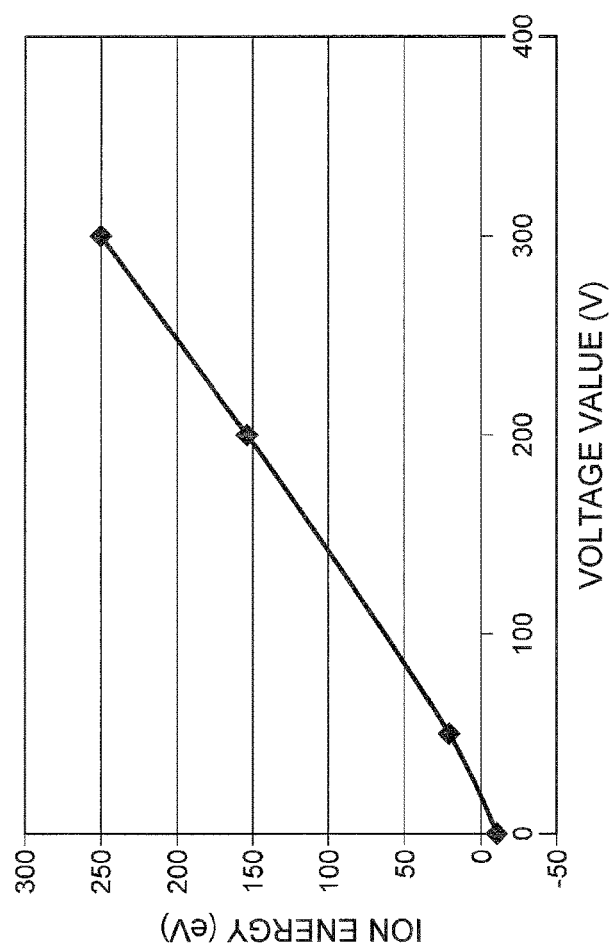
FIG. 10 is a graph illustrating a relationship between ion energy in the plasma processing apparatus illustrated in FIG. 1 and a voltage value of a pulse-modulated DC voltage.
Figure 11:
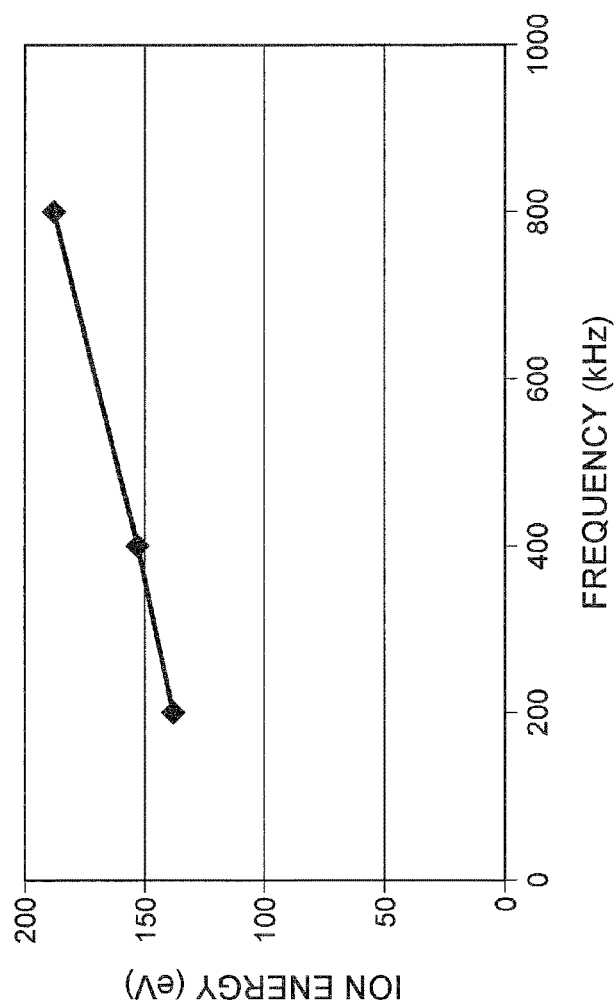
FIG. 11 is a graph illustrating a relationship between ion energy in the plasma processing apparatus illustrated in FIG. 1, and a modulation frequency of the pulse-modulated DC voltage.
Figure 12:
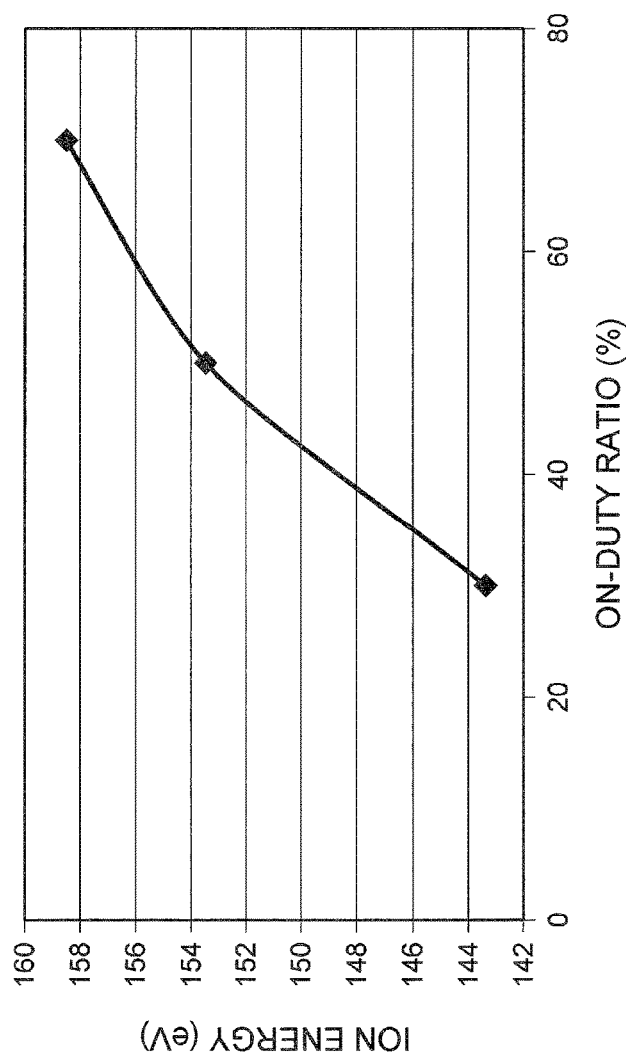
FIG. 12 is a graph illustrating a relationship between ion energy in the plasma processing apparatus illustrated in FIG. 1, and an on-duty ratio of a pulse-modulated DC voltage.

Hereinafter, the controllability of ion energy in the plasma processing apparatus 10 will be described with reference to an actual measurement result. FIG. 10 is a graph illustrating a relationship between ion energy in the plasma processing apparatus illustrated in FIG. 1 and a voltage value of a pulse-modulated DC voltage. FIG. 11 is a graph illustrating a relationship between ion energy in the plasma processing apparatus illustrated in FIG. 1, and a modulation frequency of the pulse-modulated DC voltage. FIG. 12 is a graph illustrating a relationship between ion energy in the plasma processing apparatus illustrated in FIG. 1, and an on-duty ratio of a pulse-modulated DC voltage. The ion energy illustrated in FIGS. 10, 11, and 12 was actually measured using an ion energy analyzer when plasma was generated under the following conditions. Also, the ion energy illustrated in FIG. 10 was obtained by setting the voltage value (the horizontal axis) of the modulated DC voltage to various different voltage values. Also, the ion energy illustrated in FIG. 11 was obtained by setting the modulation frequency (the horizontal axis) of the modulated DC voltage to various different frequencies. Also, the ion energy illustrated in FIG. 12 was obtained by setting the on-duty ratio (the horizontal axis) of the modulated DC voltage to various different ratios. Also, the ion energy (the vertical axis) illustrated in FIGS. 10 to 12 indicates ion energy at which an IEDF is a peak.

<Conditions>
Processing gas: Kr gas, 50 sccm
Pressure within processing container 12: 5 mTorr (0.1333 Pa)
Power of high frequency power supply 150A and high frequency power supply 150B: 50 W
Voltage value of modulated DC voltage: 200 V (variable in actual measurement in FIG. 10)
Modulation frequency of modulated DC voltage: 400 kHz (variable in actual measurement in FIG. 11)
On-duty ratio of pulse modulation of modulated DC voltage: 50% (variable in actual measurement in FIG. 12)

As illustrated in FIG. 10, it is found that when the voltage value of the modulated DC voltage applied to the support structure 18 (i.e., the lower electrode 34) is changed, it is possible to largely linearly change the ion energy. Also, as illustrated in FIGS. 11 and 12, when the modulation frequency or the on-duty ratio applied to the support structure 18 (i.e., the lower electrode 34) (that is, in the lower electrode 34) is changed, it is possible to linearly change the ion energy although there is only a small change. From these, according to the plasma processing apparatus 10, it is found that the controllability of ion energy is excellent.

Here, for a substance constituting each of layers of the multilayer film illustrated in FIG. 4, there is ion energy suitable for selectively etching the substance. Accordingly, according to the plasma processing apparatus 10 (that is, using the lower electrode 34), at least one of the voltage value, the modulation frequency and the on-duty ratio may be adjusted according to each layer in the multilayer film so as to selectively etch an etching target layer with respect to the mask MSK and the underlayer.

Also, during the etching of each layer of the multilayer film illustrated in FIG. 4, substances (that is, a metal) scraped off by etching adhere to the surface of a shape formed by etching, particularly the side surface without being exhausted. According to the plasma processing apparatus 10, when such deposits formed on the side surface are removed, the support structure 18 may be tilted, and the holding unit 30 holding the wafer W may be rotated around the second axis AX2. Accordingly, it is possible to cause ions to be incident toward the entire region of the side surface of the shape formed by etching, thereby improving the in-plane uniformity in the ions incident on the wafer W. As a result, it is possible to remove the deposits adhering to the side surface in the entire region of the side surface of the shape formed by etching, thereby improving the perpendicularity of the shape. Also, deposits may be uniformly removed in the plane of the wafer W, and the in-plane uniformity of the shape formed by etching is improved.

Figure 13:
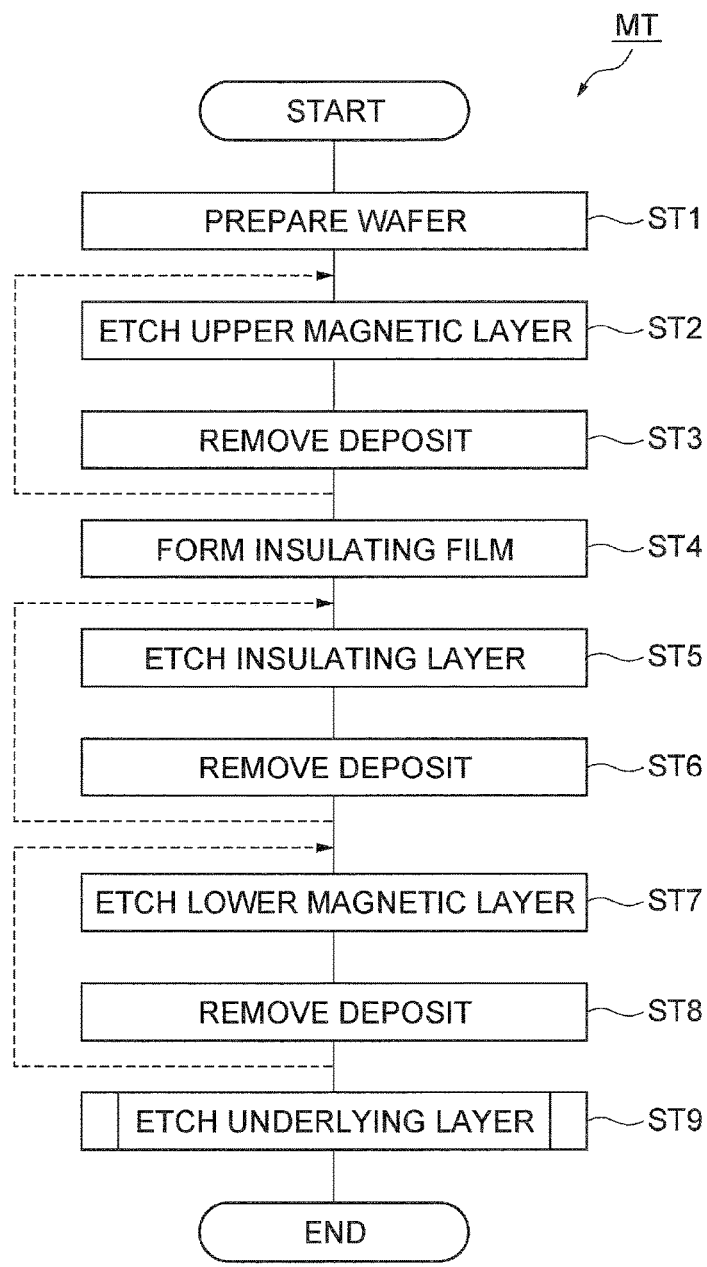
FIG. 13 is a flow chart illustrating a method of etching a multilayer film according to the exemplary embodiment.

Hereinafter, descriptions will be made on an exemplary embodiment of a method of etching the multilayer film of the wafer W illustrated in FIG. 4. FIG. 13 is a flow chart illustrating a method of etching a multilayer film according to the exemplary embodiment. The method MT illustrated in FIG. 13 may be performed using the plasma processing apparatus 10 illustrated in, for example, FIG. 1. In the method, each layer of the multilayer film illustrated in FIG. 4 is etched by using ions having energy suitable for the etching. Here, prior to the description on the method MT, a relationship between the kind and ion energy of a rare gas, and the sputtering yields SY of various metals or metal compounds will be described.

Figure 14:
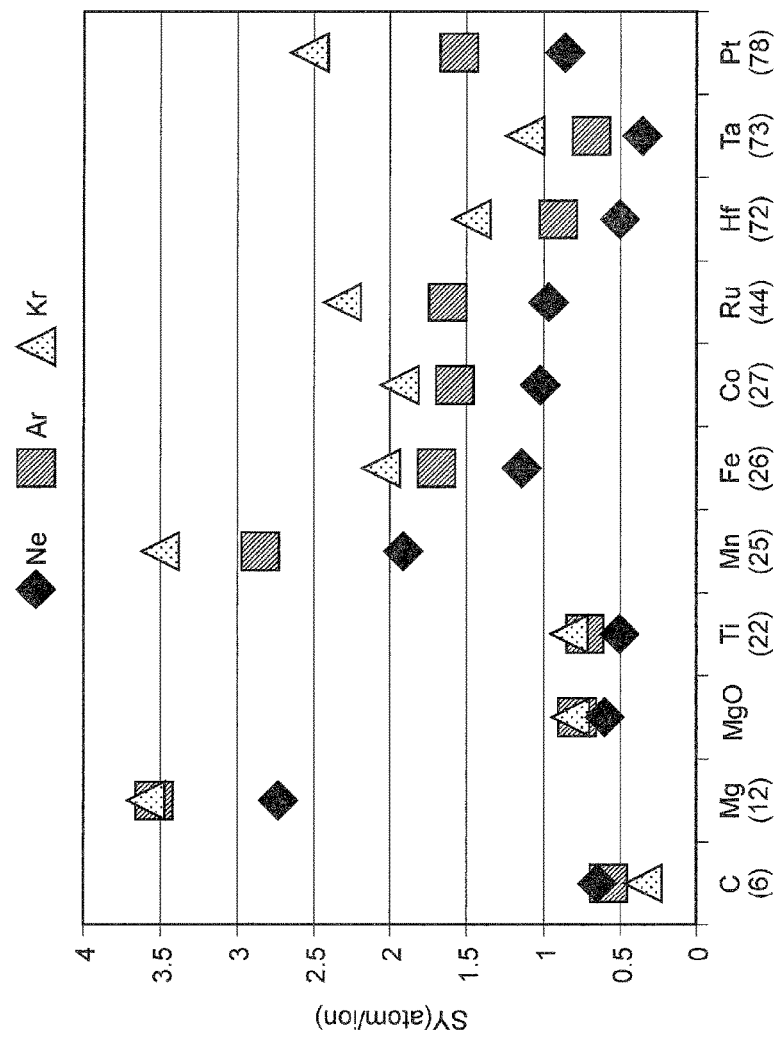
FIG. 14 is a view illustrating sputtering yields SY of various metals or metal compounds by ions of a rare gas atom having ion energy of 1000 eV.
Figure 15:
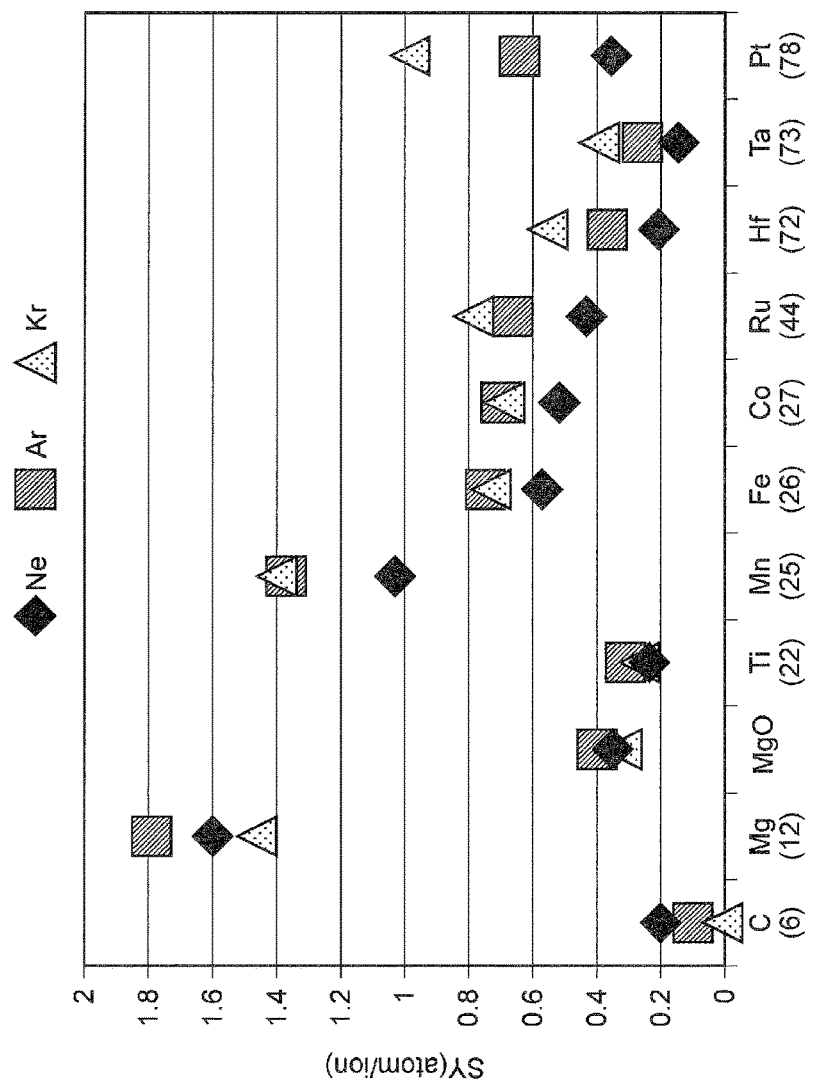
FIG. 15 is a view illustrating sputtering yields SY of various metals or metal compounds by ions of a rare gas atom having ion energy of 300 eV.

FIG. 14 is a view illustrating sputtering yields SY of various metals or metal compounds by ions of a rare gas atom having ion energy of 1000 eV. FIG. 15 is a view illustrating sputtering yields SY of various metals or metal compounds by ions of a rare gas atom having ion energy of 300 eV. In FIGS. 14 and 15, the horizontal axis indicates the kinds of metals or metal compounds, and the vertical axis indicates the sputtering yield SY. Also, the sputtering yield SY corresponds to the number of constituent atoms released from an etching target layer when one ion is incident on the etching target layer. Here, the relatively high ion energy of 1000 eV is obtained by using a high-frequency bias power or a modulated DC voltage having a relatively high voltage value. Meanwhile, the relatively low ion energy of 300 eV is obtained by using a modulated DC voltage having a relatively low voltage value.

As illustrated in FIG. 14, a Kr ion with 1000 eV has a sputtering yield SY of about 2 for Co and Fe, and has a sputtering yield SY around 1 for Ta, Ti, and MgO. Accordingly, under the condition for radiating the Kr ion with 1000 eV toward the wafer W, the upper magnetic layer L4 may be etched, and deposits generated by etching the upper magnetic layer L4 may be removed. However, the mask MSK and the insulating layer L3 that is an underlayer are also etched although the rate is lower than that in the removal of the upper magnetic layer L4 and deposits generated from the upper magnetic layer L4.

Meanwhile, as illustrated in FIG. 15, a Kr ion with 300 eV has a sputtering yield SY close to 1 for Co and Fe, and has a sputtering yield SY of about 0.4 or less for Ta, Ti, and MgO. Accordingly, under the condition for radiating the Kr ion with 300 eV toward the wafer W, it is possible to etch the upper magnetic layer L4, and remove deposits generated by etching the upper magnetic layer L4 while substantially not etching the mask MSK and the insulating layer L3 that is an underlayer. That is, by using the modulated DC voltage at which ions having relatively low ion energy may be radiated, the upper magnetic layer L4 and the deposits generated from the upper magnetic layer L4 may be selectively removed with respect to the mask MSK and the insulating layer L3 as the underlayer.

Also, as illustrated in FIG. 15, the Kr ion with 300 eV has a sputtering yield SY of about 0.4 for MgO, while as illustrated in FIG. 14, the Kr ion with 1000 eV has a sputtering yield close to 1 for MgO. Accordingly, by using the modulated DC voltage or the high-frequency bias power at which ions having relatively high ion energy may be radiated, the insulating layer L3 may be etched.

Also, when only a rare gas is used, the sputtering yield of the insulating layer L3 is relatively low. However, when a hydrogen-containing gas that exerts a reduction action is used in addition to the rare gas, MgO of the insulating layer L3 may be reformed to Mg for which a high sputtering yield SY may be obtained (see, e.g., a sputtering yield SY of Mg in FIG. 14). Accordingly, the insulating layer L3 may be etched at a high etching rate.

Similarly, the lower magnetic layer L2 and the underlying layer L1 below the insulating layer L3 may also be etched using the same conditions as those for etching of the insulating layer L3. Meanwhile, as described above in relation to FIG. 14, the Kr ion with 1000 eV may etch the mask MSK as well. Thus, particularly, in the etching of the underlying layer L1, Kr gas and Ne gas may be alternately used. The Kr ion with 1000 eV has a high sputtering yield SY for, for example, Co, Fe, Ru, Pt, and Mn that constitute the underlying layer L1. That is, a shape with a high perpendicularity may be formed and a large amount of deposits may be removed by generating plasma of a processing gas containing a first rare gas such as Kr gas, and using the modulated DC voltage or the high-frequency bias power at which Kr ions having relatively high energy may be radiated.

Meanwhile, a Ne ion with 1000 eV has a low sputtering yield SY, but around 1, for, for example, Co, Fe, Ru, Pt, and Mn that constitute the underlying layer L1. Also, the Ne ion with 1000 eV has a sputtering yield SY lower than 1 for Ti or Ta that may constitute the mask MSK. That is, by generating plasma of a processing gas containing a second rare gas such as the Ne gas, and using the modulated DC voltage or the high-frequency bias power at which Ne ions having relatively high energy may be radiated, it is possible to etch the underlying layer L1 while substantially not etching the mask MSK. Accordingly, even under the condition for radiating ions having relatively high ion energy toward the wafer W, the underlying layer L1 may be selectively etched using alternately the first rare gas and the second rare gas. Also, it is possible to increase the perpendicularity of the shape formed on the underlying layer L1, thereby removing deposits generated by etching.

Referring back to FIG. 13, the method MT illustrated in FIG. 13 at least partially uses the above described characteristics described with reference to FIGS. 14 and 15. Hereinafter, the method MT will be described in detail with reference to FIGS. 16 to 20 as well as FIG. 13. FIGS. 16 to 20 are sectional views illustrating a state of a processing target during each step or after each step in the method MT. Also, in the following description, it is assumed that the plasma processing apparatus 10 is used for implementing the method MT. However, any plasma processing apparatus may be used for implementing the method MT as long as the plasma processing apparatus may tilt a support structure, rotate a holding unit that holds a wafer W, and apply a modulated DC voltage from a bias power supply unit to the support structure.

In the method MT, first, in step ST1, the wafer W illustrated in FIG. 4 is prepared and accommodated in the processing container 12 of the plasma processing apparatus 10. Then, the wafer W is held by the electrostatic chuck 32 of the holding unit 30.

In the subsequent step ST2, the upper magnetic layer L4 is etched. In step ST2, a rare gas and a hydrogen-containing gas are supplied into the processing container 12. In an exemplary embodiment, the rare gas is a rare gas having an atomic number larger than the atomic number of argon, for example, Kr gas. Further, the hydrogen-containing gas is, for example, $CH_4$ gas or $NH_3$ gas.

Also, in step ST2, the pressure in the space S within the processing container 12 is reduced to a predetermined pressure by the exhaust system 20. For example, the pressure in the space S within the processing container 12 is set to a pressure within the range of 0.4 mTorr (0.5 Pa) to 20 mTorr (2.666 Pa). Also, in step ST2, the rare gas and the hydrogen-containing gas are excited by the plasma source 16. Therefore, the high frequency power supply 150A and the high frequency power supply 150B of the plasma source 16 supply high frequency powers with a frequency of, for example, 27.12 MHz or 40.68 MHz, and a power value ranging from 10 W to 3000 W, to the inner antenna element 142A and the outer antenna element 142B. Also, in step ST2, a modulated DC voltage is applied to the support structure 18 (the lower electrode 34). The voltage value of the DC voltage is set to a relatively low voltage value in order to suppress etching of the mask MSK and the insulating layer L3. For example, the voltage value of the DC voltage is set to a voltage value of 300 V or less, for example, 200 V. Also, the modulation frequency of the DC voltage is set to, for example, 400 kHz. Further, the on-duty ratio of pulse modulation of the DC voltage is set to a ratio ranging from 10% to 90%.

Also, in step ST2, the support structure 18 may be set to a non-inclined state. That is, in step ST2, the support structure 18 is arranged such that the second axis AX2 coincides with the axis PX. Also, the support structure 18 may be set to an inclined state during the whole or a part of the period of step ST2. That is, during the whole or a part of the period of step ST2, the support structure 18 may be arranged such that the second axis AX2 is inclined with respect to the axis PX. For example, the support structure 18 may be alternately set to a non-inclined state and an inclined state during the period of step ST2.

In step ST2, the ions generated under the above-described conditions are accelerated by the sheath generated by the modulated DC voltage and are incident on the upper magnetic layer L4. The energy of the ions etches the upper magnetic layer L4 made of Co and Fe, but does not substantially etch the mask MSK made of Ta and TiN and the insulating layer L3 made of MgO. Therefore, in step ST2, the upper magnetic layer L4 may be selectively etched with respect to the mask MSK and the insulating layer L3. Also, in step ST2, the active species of hydrogen derived from the hydrogen-containing gas reforms the surface of the upper magnetic layer L4. As a result, etching of the upper magnetic layer L4 is promoted. Further, in step ST2, a metal compound is formed by reaction of nitrogen or carbon in the hydrogen-containing gas with the mask MSK. Accordingly, the mask MSK is strengthened, and etching of the mask MSK is suppressed.

Figure 16:
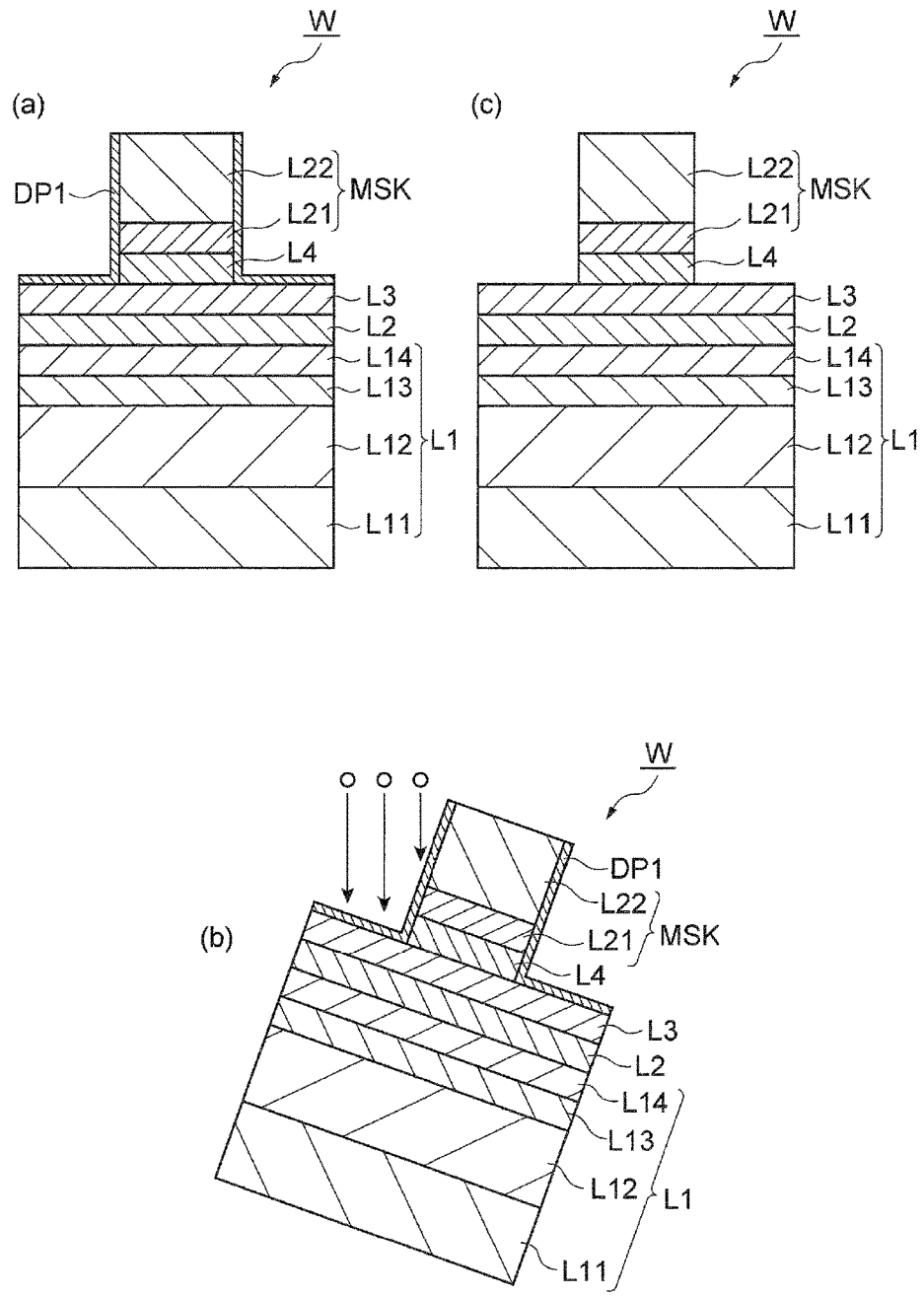
FIG. 16 is a sectional view illustrating a state of the processing target during or after each step of the method MT.
Figure 17:
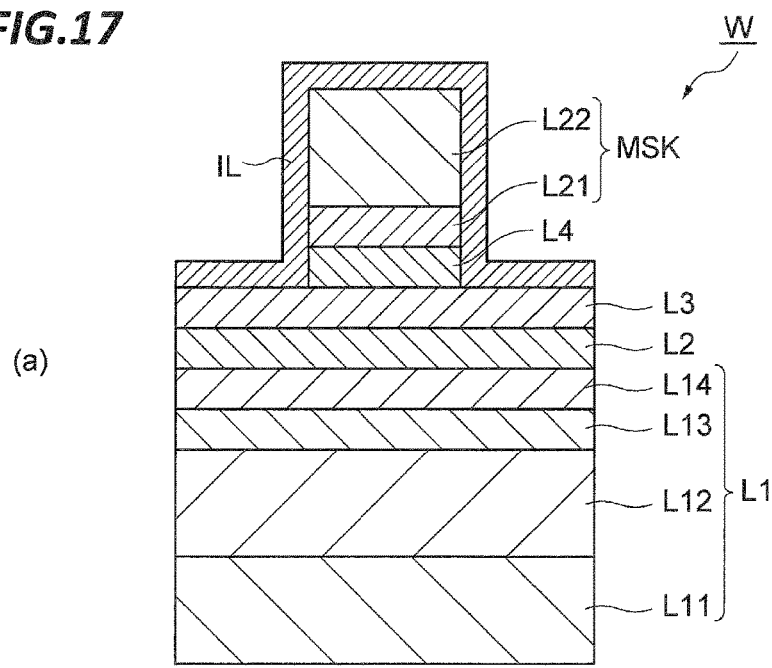
FIG. 17 is a sectional view illustrating a state of the processing target during or after each step of the method MT.
Figure 17:
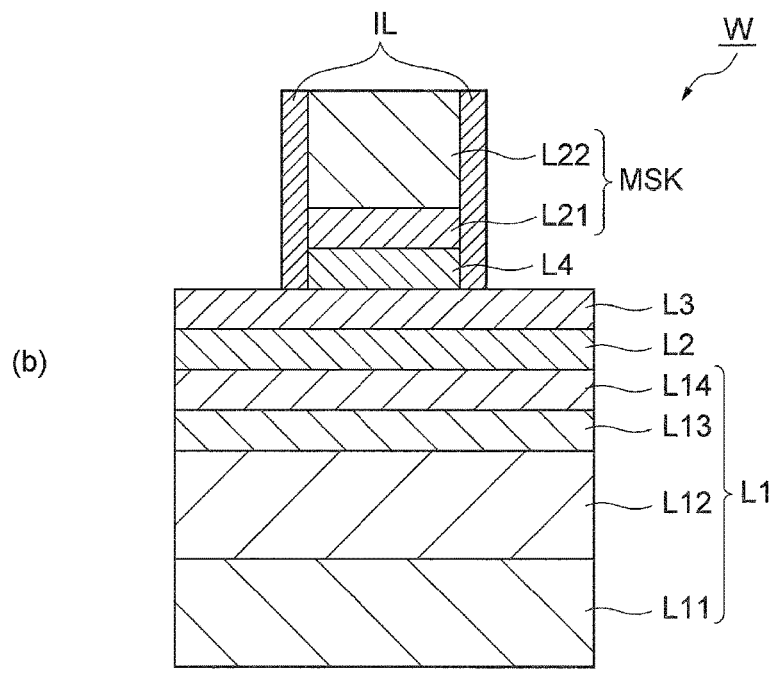
Figure 18:
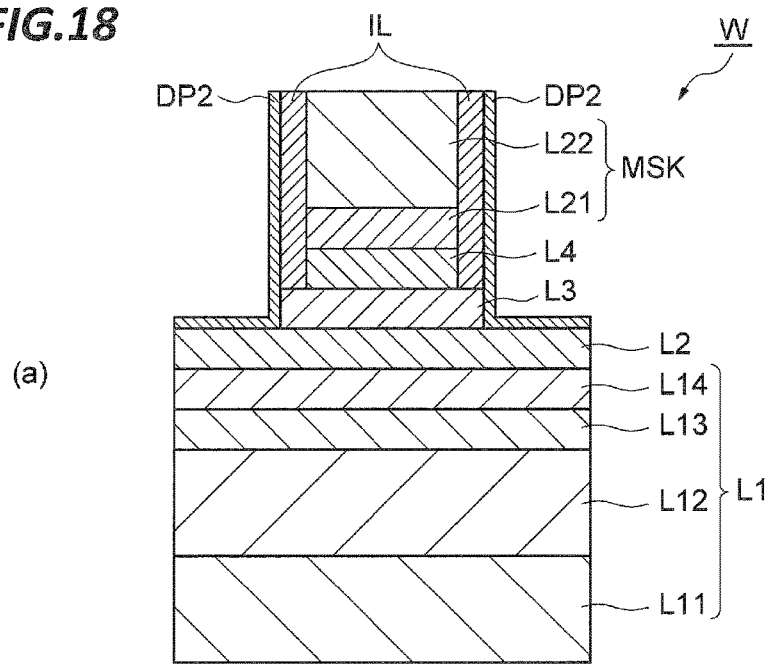
FIG. 18 is a sectional view illustrating a state of the processing target during or after each step of the method MT.
Figure 18:
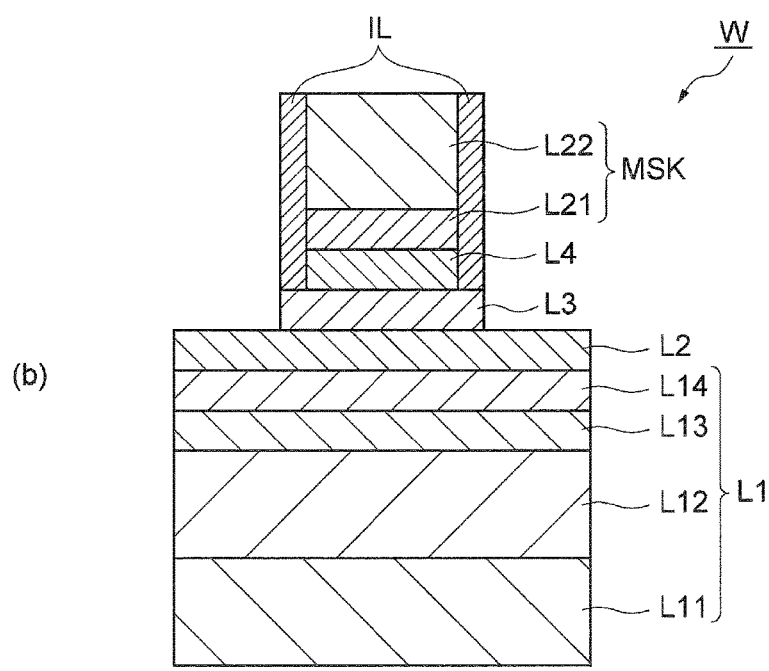

Through the execution of step ST2, as illustrated in (a) of FIG. 16, the upper magnetic layer L4 is etched, but the constituent substances of the upper magnetic layer L4, for example, Co and Fe, may adhere to the surface of the wafer W without being exhausted. The constituent substances adhere to, for example, the side surface of the mask MSK, the side surface of the upper magnetic layer L4, and the top surface of the insulating layer L3. As a result, a deposit DP1 is formed as illustrated in (a) of FIG. 16.

In the subsequent step ST3, the deposit DP1 is removed. In step ST3, in order to remove the deposit DP1 adhering to the side surface of the mask MSK and the side surface of the upper magnetic layer L4, the support structure 18 is set to an inclined state. That is, an inclination of the support structure 18 is set so that the second axis AX2 is inclined with respect to the axis PX. The angle of the inclination, that is, the angle of the second axis AX2 with respect to the axis PX may be arbitrarily set and may be, for example, an angle larger than 0° and equal to or smaller than 60°. Also, in step ST3, the holding unit 30 is rotated around the second axis AX2. The number of revolutions in the rotation may be arbitrarily set, and may be, for example, 20 rpm. Other conditions in step ST3 may be the same as the conditions in step ST2. That is, in step ST3, a rare gas having an atomic number larger than the atomic number of argon, e.g., Kr gas, and a hydrogen-containing gas are supplied into the processing container 12. Also, the rare gas and the hydrogen gas hydrogen-containing gas are excited by the plasma source 16. Also, in step ST3, a modulated DC voltage is applied to the support structure 18 (the lower electrode 34).

In step ST3, as illustrated in (b) of FIG. 16, the deposit DP1 is arranged while intersecting with an attracting direction (indicated by downward arrows in the drawing) of ions (indicated by circles in the drawing). That is, the wafer W is arranged such that ions may be incident onto the side surface of the upper magnetic layer L4 and the side surface of the mask MSK. Also, in step ST3, since the holding unit 30 is rotated, ions are incident onto the entire region of the side surface of the upper magnetic layer L4 and the entire region of the side surface of the mask MSK. Also, the ions are substantially uniformly incident within the plane of the wafer W. Accordingly, as illustrated in (c) of FIG. 16, it is possible to remove the deposit DP1 in the entire region of the side surface of the upper magnetic layer L4 and the entire region of the side surface of the mask MSK, thereby improving the perpendicularity of a shape formed in the upper magnetic layer L4. Also, the in-plane uniformity of the shape formed in the upper magnetic layer L4 may be improved. Also, in step ST3, the active species of hydrogen derived from the hydrogen-containing gas reforms the deposit DP1. Accordingly, removal of the deposit DP1 is promoted.

Also, step ST2 and step ST3 may be alternately executed a plurality of times. Accordingly, before a large amount of deposit DP1 is formed, it is possible to etch the upper magnetic layer L4 while removing the deposit DP1.

In the subsequent step ST4, an insulating film IL is formed. The insulating film IL is formed to prevent conduction between the lower magnetic layer L2 and the upper magnetic layer L4. Specifically, in step ST4, the wafer W is conveyed to a film forming apparatus, and the insulating film IL is formed on the surface of the wafer W in the film forming apparatus as illustrated in (a) of FIG. 17. The insulating film IL may be made of, for example, silicon nitride or silicon oxide. Next, the insulating film IL is etched in the region along the top surface of the mask MSK and the region along the top surface of the insulating layer L3. For the etching, any plasma processing apparatus may be used. For example, for the etching, the plasma processing apparatus 10 may be used. Also, in the etching, a processing gas containing a hydrofluorocarbon gas or a fluorocarbon gas may be used. As a result of the etching, as illustrated in (b) of FIG. 17, the insulating film IL is left along the side surface of the mask MSK and the side surface of the upper magnetic layer L4.

In the subsequent step ST5, the insulating layer L3 is etched. In step ST5, a rare gas and a hydrogen-containing gas are supplied into the processing container 12. The rare gas is a rare gas having an atomic number larger than the atomic number of argon, for example, Kr gas. Further, the hydrogen-containing gas is, for example, $CH_4$ gas or $NH_3$ gas. Also, in step ST5, the pressure in the space S within the processing container 12 is reduced to a predetermined pressure by the exhaust system 20. For example, the pressure in the space S within the processing container 12 is set to a pressure within the range of 0.4 mTorr (0.5 Pa) to 20 mTorr (2.666 Pa). Also, in step ST5, the rare gas and the hydrogen-containing gas are excited by the plasma source 16. Therefore, the high frequency power supply 150A and the high frequency power supply 150B of the plasma source 16 supply high frequency powers with a frequency of, for example, 27.12 MHz or 40.68 MHz, and a power value ranging from 10 W to 3000 W, to the inner antenna element 142A and the outer antenna element 142B.

As described above, in the etching of the insulating layer L3, it is required to cause ions with relatively high ion energy to be incident on the wafer W. Thus, in step ST5, a modulated DC voltage having a voltage value higher than the modulated DC voltage applied to the support structure 18 (the lower electrode 34) in step ST2, or a high-frequency bias power is supplied to the support structure (the lower electrode 34). When the modulated DC voltage is used, the on-duty ratio and the modulation frequency in pulse modulation of the modulated DC voltage may be the same as the on-duty ratio and the modulation frequency in pulse modulation of the DC voltage in step ST2, but the voltage value of the DC voltage is set to a voltage value larger than 300 V. Meanwhile, when the high-frequency bias power is used, the high-frequency bias power may be set to range from 100 W to 1500 W, and the frequency may be set to 400 kHz. Also, in step ST5, the support structure 18 may be set to a non-inclined state. That is, in step ST5, the support structure 18 is arranged such that the second axis AX2 coincides with the axis PX. Also, during the whole or a part of the period in step ST5, the support structure 18 may be set to an inclined state. That is, during the whole or a part of the period in step ST5, the support structure 18 may be arranged such that the second axis AX2 is inclined with respect to the axis PX. For example, the support structure 18 may be alternately set to a non-inclined state and an inclined state during the period of step ST5.

In step ST5, the ions generated under the above-described conditions are incident on the insulating layer L3. The ions may have energy capable of etching the insulating layer L3. Also, constituent substances of the insulating layer L3 are reduced by active species of hydrogen derived from the hydrogen-containing gas used in step ST5. For example, MgO is reduced. Accordingly, as described with reference to FIG. 14, the insulating layer L3 is reformed to obtain a high sputtering yield SY. As a result, the etching rate of the insulating layer L3 is increased. By step ST5, the insulating layer L3 is etched as illustrated in (a) of FIG. 18. In step ST5, constituent substances of the insulating layer L3 may be adhere to the surface of the wafer W without being exhausted. For example, the constituent substances adhere to the side surface of the mask MSK, the side surface of the upper magnetic layer L4, the side surface of the insulating layer L3, and the top surface of the lower magnetic layer L2. As a result, a deposit DP2 is formed.

In the subsequent step ST6, the deposit DP2 is removed. In step ST6, in order to remove the deposit DP2, the support structure 18 is set to an inclined state. That is, an inclination of the support structure 18 is set so that the second axis AX2 is inclined with respect to the axis PX. The angle of the inclination, that is, the angle of the second axis AX2 with respect to the axis PX may be arbitrarily set and may be, for example, an angle larger than 0° and equal to or smaller than 60°. Also, in step ST6 [[ST3]], the holding unit 30 is rotated around the second axis AX2. The number of revolutions in the rotation may be arbitrarily set, and may be, for example, 20 rpm. Other conditions in step ST6 are the same as the conditions in step ST5. According to step ST6, since ions may be efficiently incident on the deposit DP2, the deposit DP2 may be removed as illustrated in (b) of FIG. 18. Also, by using a hydrogen-containing gas, it is possible to reform the deposit DP2, and promote the removal of the deposit DP2.

Here, step ST5 and step ST6 may be alternately executed a plurality of times. Accordingly, before a large amount of deposit DP2 is formed, it is possible to etch the insulating layer L3 while removing the deposit DP2.

Figure 19:
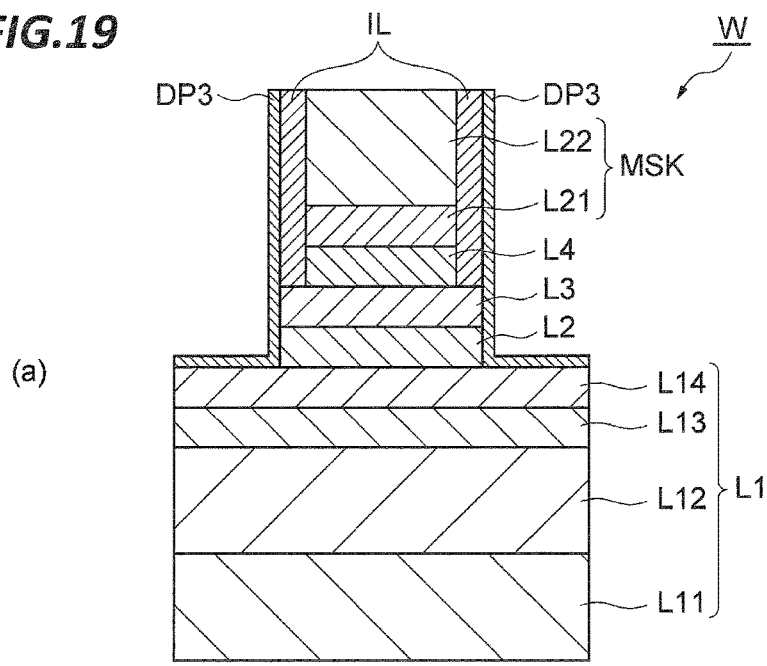
FIG. 19 is a sectional view illustrating a state of the processing target during or after each step of the method MT.
Figure 19:
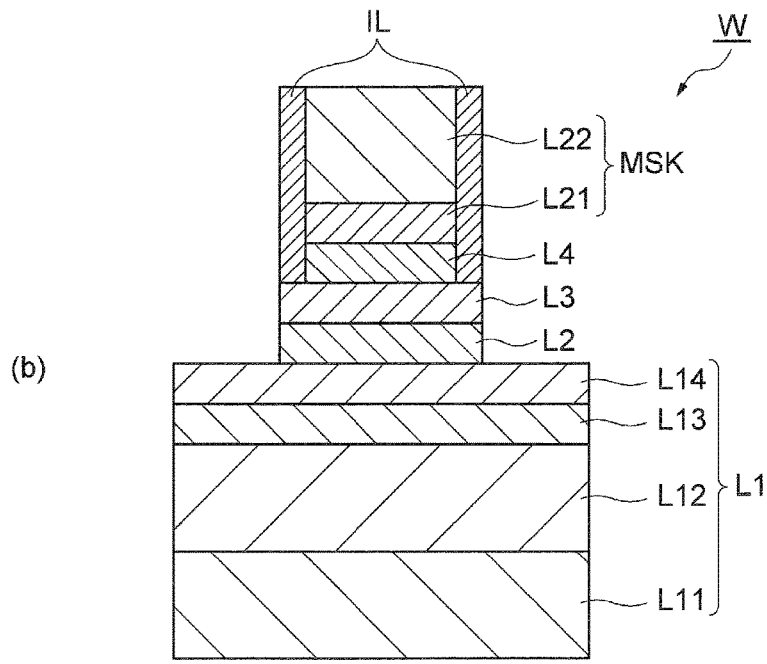

In the subsequent step ST7, as illustrated in (a) of FIG. 19, the lower magnetic layer L2 is etched, and in the subsequent step ST8, a deposit DP3 generated by etching in step ST7 is removed as illustrated in (b) of FIG. 19. Since the lower magnetic layer L2 is made of the same material as the upper magnetic layer L4, in the exemplary embodiment, conditions for step ST7 may be the same as those for step ST2. Also, conditions for step ST8 may be the same as those for step ST3. Also, step ST7 and step ST8 may be alternately executed a plurality of times. That is, in both steps ST7 and ST8, plasma of a rare gas (e.g., Kr gas) and a hydrogen-containing gas is generated and a modulated DC voltage is applied to the lower electrode 34 of the support structure 18. The voltage value of the modulated DC voltage is 300 V or less, e.g., 200 V. Also, in step ST8, while the support structure 18 is set to an inclined state, the holding unit 30 is rotated. Also, during a part of the entire period of step ST7, the support structure 18 may be set to an inclined state and the holding unit 30 may be rotated.

Alternatively, in another exemplary embodiment, conditions for step ST7 may be the same as those for step ST5, and conditions for step ST8 may be the same as those for step ST6. That is, in both steps ST7 and ST8, plasma of a rare gas (e.g., Kr gas) and a hydrogen-containing gas is generated and a modulated DC voltage having a relatively high voltage value higher than, for example, 300 V, or a high-frequency bias power is supplied to the lower electrode 34 of the support structure 18. Also, in step ST8, while the support structure 18 is set to an inclined state, the holding unit 30 is rotated. Also, during a part of the entire period of step ST7, while the support structure 18 may be set to an inclined state, the holding unit 30 may be rotated. In the exemplary embodiment, the insulating layer L3 and the lower magnetic layer L2 may be collectively etched under the same conditions.

In the subsequent step ST9, the underlying layer L1 is etched. In the exemplary embodiment, etching is performed on the underlying layer L1 from the non-magnetic layer L14 to the antiferromagnetic layer L12 just above the surface (top surface) of the lower electrode layer L11.

Figure 21:
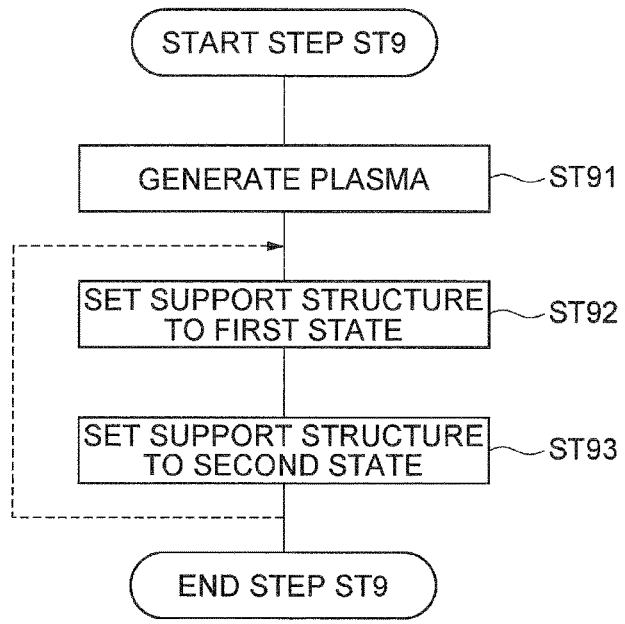
FIG. 21 is a flow chart illustrating an exemplary embodiment in step ST9.

FIG. 21 is a flow chart illustrating an exemplary embodiment in step ST9. As illustrated in FIG. 21, in step ST9 in the exemplary embodiment, first, plasma is generated within the processing container 12 in step ST91. The conditions for generating plasma in step ST91 are the same as the conditions in step ST5. That is, in the exemplary embodiment, the conditions in step ST5 may be used to collectively etch the insulating layer L3, the lower magnetic layer L2, and layers from the non-magnetic layer L14 to the antiferromagnetic layer L12. Also, in step ST9, steps ST92 and ST93 are executed while the plasma generating conditions set in step ST91 are maintained. In step ST92, the support structure 18 is set to a first state, that is, a non-inclined state. In the subsequent step ST93, while the support structure 18 is maintained at a second state, that is, an inclined state, the holding unit 30 is rotated. The inclination angle of the support structure 18 is, for example, an angle larger than 0° and equal to or smaller than 60°. Also, the number of revolutions of the holding unit 30 is, for example, 20 rpm.

Figure 20:
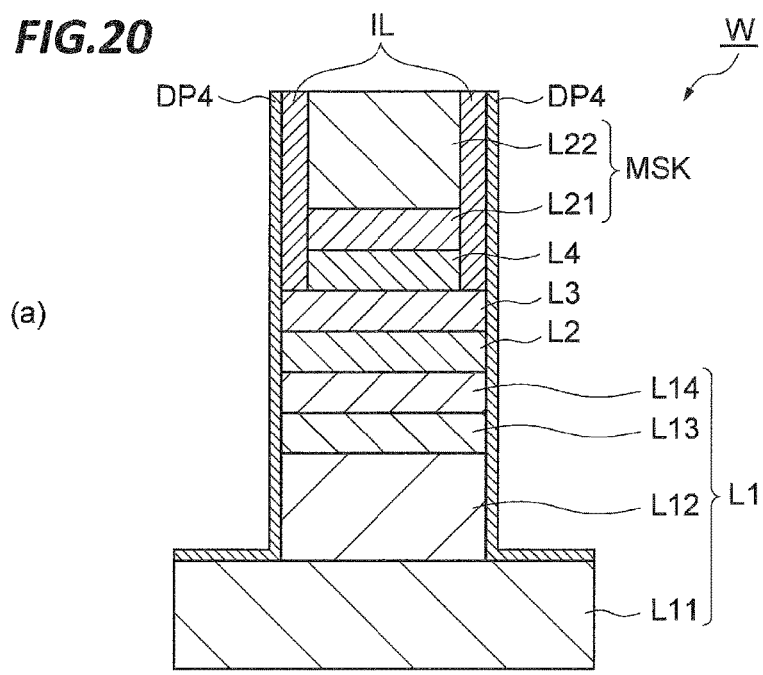
FIG. 20 is a sectional view illustrating a state of the processing target during or after each step of the method MT.
Figure 20:
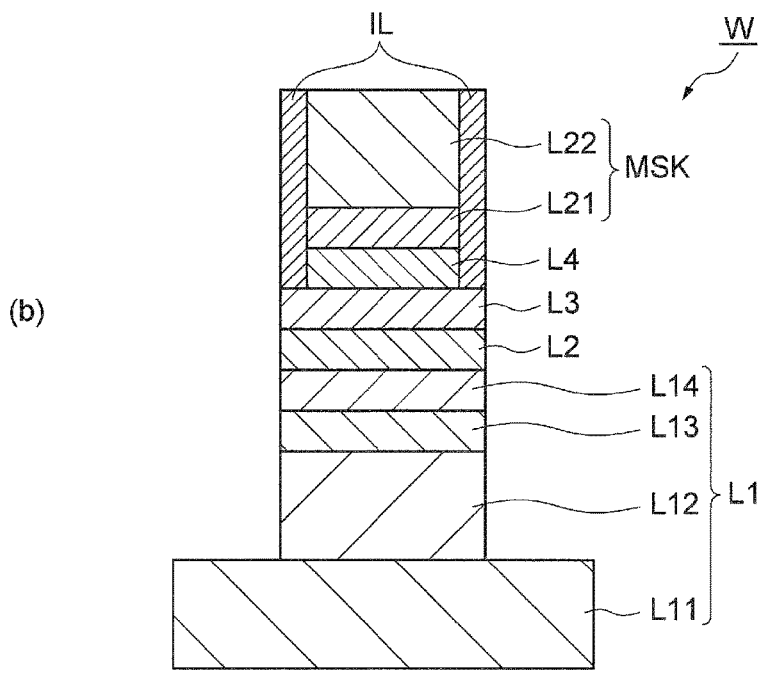

According to the exemplary embodiment illustrated in FIG. 21, in step ST92, as illustrated in (a) of FIG. 20, respective layers from the non-magnetic layer L14 to the antiferromagnetic layer L12 are etched, and a deposit DP4 generated by the etching is removed in step ST93 (see, e.g., (b) of FIG. 20). Accordingly, the deposit adhering to the side surface of the shape formed by etching the wafer W is removed from the entire region of the side surface of the shape, and also uniformly removed in the plane of the wafer W. Accordingly, the perpendicularity of a shape foimed by etching the wafer W is improved.

Figure 22:
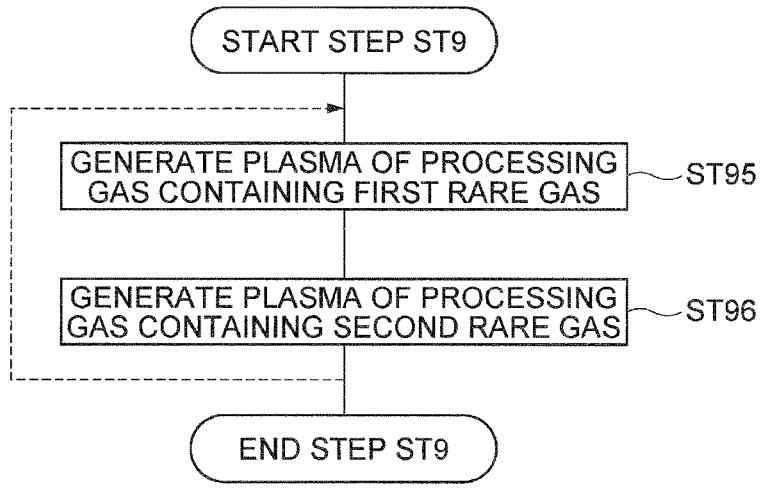
FIG. 22 is a flow chart illustrating another exemplary embodiment in step ST9.

FIG. 22 is a view illustrating another exemplary embodiment in step ST9. The step ST9 illustrated in FIG. 22 includes steps ST95 and ST96. In step ST95, plasma of a processing gas containing a first rare gas having an atomic number larger than the atomic number of argon is generated. The first rare gas is, for example, Kr gas. In step ST96, plasma of a processing gas containing a second rare gas having an atomic number smaller than the atomic number of argon is generated. The second rare gas is, for example, Ne gas. Also, in the exemplary embodiment, in both steps ST95 and ST96, a high-frequency bias power may be supplied to the support structure 18 (the lower electrode 34). Also, during the whole or a part of the period in at least one of steps ST95 and ST96, while the support structure 18 is inclined, the holding unit 30 is rotated.

As described above, Kr ions having relatively high energy have a high sputtering yield SY for, for example, Co, Fe, Ru, Pt, and Mn which constitute the underlying layer L1. Accordingly, by the processing gas containing the first rare gas such as Kr gas, a shape with a high perpendicularity may be formed in the underlying layer L1, and a deposit generated by the etching may be efficiently removed. Meanwhile, Ne ions having relatively high energy have a low sputtering yield SY, but around 1, for, for example, Co, Fe, Ru, Pt, and Mn which constitute the underlying layer L1. Also, Ne ions having relatively high energy have a sputtering yield SY lower than 1 for Ti or Ta that may constitute the mask MSK. Accordingly, the processing gas containing the second rare gas such as Ne may etch the underlying layer L1 while substantially not etching the mask MSK. By alternately using the first rare gas and the second rare gas, the underlying layer L1 may be selectively etched with respect to the mask MSK, so that the perpendicularity of a shape formed in the underlying layer L1 may be improved and the deposit generated by the etching may be removed.

Although various exemplary embodiments have been described above, various modifications may be configured without being limited to the above described exemplary embodiments. For example, in the exemplary embodiment illustrated in FIG. 21, in step ST92, a high-frequency bias power may be supplied to the support structure 18 (that is, the lower electrode 34), and in step ST93, a modulated DC voltage may be applied to the support structure 18 (that is, the lower electrode 34). That is, in step ST92, the high-frequency bias power may be used for main etching from the non-magnetic layer L14 to the antiferromagnetic layer L12, and the modulated DC voltage may be used for removing the deposit generated by the main etching, that is, over-etching.

DESCRIPTION OF SYMBOL

10: plasma processing apparatus
12: processing container
14: gas supply system
14a: first gas supply unit
14b: second gas supply unit
16: plasma source
18: support structure
20: exhaust system
20b: turbo molecular pump
22: bias power supply unit
22a: first power supply
22b: second power supply
24: driving device
26: rectifying member
30: holding unit
32: electrostatic chuck
34: lower electrode
34f: refrigerant flow path
36: rotating shaft unit
40: container unit
50: tilting shaft unit
52: magnetic fluid seal unit
54: rotary connector
60: wiring
62: power supply
64: wiring
66: pipe
68: heat transfer gas source
70: rotary joint
72: pipe
74: pipe
76: chiller unit
78: rotary motor
80: pulley
82: conduction belt 150A, 150B: high frequency power supply
AX1: first axis
AX2: second axis
Cnt: controller
W: wafer
L1: underlying layer
L11: lower electrode layer
L12: antiferromagnetic layer
L13: ferromagnetic layer
L14: non-magnetic layer
L2: lower magnetic layer
L3: insulating layer
L4: upper magnetic layer
MSK: mask
MT: method

What is claimed is:

1. A method of etching a multilayer film of a processing target using a plasma processing apparatus,
the processing target including an underlying layer, a lower magnetic layer provided on the underlying layer, an insulating layer provided on the lower magnetic layer, an upper magnetic layer provided on the insulating layer, and a mask provided on the upper magnetic layer,
the plasma processing apparatus including a processing container, a gas supply system that supplies a rare gas and a hydrogen-containing gas into the processing container, a high frequency power supply for plasma generation, and a support structure that supports the processing target, and
the method comprising:
sequentially etching the upper magnetic layer, the insulating layer, the lower magnetic layer and the underlying layer by plasma generated from the rare gas supplied into the processing container while modifying, by the hydrogen-containing gas, one of the upper magnetic layer, the insulating layer, the lower magnetic layer and the underlying layer that is being etched, and wherein the etching of the upper magnetic layer is terminated on a surface of the insulating layer, the etching of the insulating layer is terminated on a surface of the lower magnetic layer, and the etching of the lower magnetic layer is terminated on a surface of the underlying layer,
wherein each etching step generates a deposit formed on a surface of the processing target,
wherein after each step of etching the upper magnetic layer, the insulating layer, the lower magnetic layer, and the underlying layer, the sequentially etching comprises:
a step of rotating the support structure about a first axis passing horizontally through the support structure to tilt the support structure at a predetermined angle with respect to a second axis extending orthogonal to the first axis, while simultaneously rotating the processing target about the second axis such that ions of the rare gas intersect at an incident direction with the deposit formed on the surface of the processing target, thereby removing the deposit, and
wherein the step of removing the deposit, a pulse-modulated DC voltage as a bias voltage for ion attraction is applied to the support structure,
further comprising:
after the step of removing the deposit generated during the step of etching the upper magnetic layer and before the step of etching the insulating layer, transferring the processing target to a film forming apparatus and forming an insulating film on a surface of the processing target; and
after the step of forming the insulating film, etching a top surface of the mask and a top surface of the insulating layer in the plasma processing apparatus by plasma generated from one of a hydrofluorocarbon gas and a fluorocarbon gas.

2. The method of claim 1, wherein the step of removing the deposit, plasma is generated from the rare gas comprising an atomic number larger than an atomic number of argon.

3. The method of claim 1, wherein the steps of etching the upper magnetic layer and removing of the deposit are alternately repeated.

4. The method of claim 1, wherein the pulse-modulated DC voltage has a period having a high level and a period having a low level in one cycle, and a duty ratio of the DC voltage, which is a ratio of the period having the high level in one cycle, ranges from 10% to 90%.

5. The method of claim 1, wherein the step of etching the upper magnetic layer, plasma is generated from the rare gas comprising an atomic number larger than an atomic number of argon, and the pulse-modulated DC voltage as a bias voltage for ion attraction is applied to the support structure.

6. The method of claim 5, wherein the step of etching the insulating layer, plasma is generated from the rare gas comprising an atomic number larger than the atomic number of argon, and a pulse-modulated DC voltage higher than the DC voltage applied to the support structure in the step of etching the upper magnetic layer or a high-frequency bias power is applied to the support structure.

7. The method of claim 1, wherein the step of etching the underlying layer, plasma is generated from the rare gas, and a pulse-modulated DC voltage higher than the DC voltage applied to the support structure in the step of etching the upper magnetic layer or a high-frequency bias power is applied to the support structure.

8. The method of claim 7, wherein the step of etching the underlying layer includes setting the support structure to a non-inclined first state, and setting the support structure to an inclined and rotary second state.

9. The method of claim 8, wherein the step of setting the support structure to the inclined and rotary second state, the processing target is simultaneously rotated about the second axis.

10. The method of claim 7, wherein the step of etching the underlying layer includes a first step of generating plasma of a processing gas containing a first rare gas having an atomic number larger than an atomic number of argon, and a second step of generating plasma of a processing gas containing a second rare gas having an atomic number smaller than the atomic number of argon.

11. The method of claim 10, wherein the step of etching the underlying layer, a high-frequency bias power is supplied to the support structure.

12. The method of claim 10, wherein at least one of the first step and the second step, the support structure is inclined and rotated.

13. The method of claim 10, wherein the first rare gas includes a Kr gas, and the second rare gas includes a Ne gas.

14. The method of claim 1, wherein the predetermined angle is set in a range of 0° to 60°.

15. The method of claim 1, wherein the pulse-modulated DC voltage is set in a range of 0 V to 1200 V.

16. The method of claim 1, wherein a modulation frequency of the pulse-modulated DC voltage is 400 kHz.

\* \* \* \* \*